(12) United States Patent
Pendse

(10) Patent No.: US 11,037,915 B2
(45) Date of Patent: Jun. 15, 2021

(54) INTEGRATED DISPLAY DEVICES

(71) Applicant: Facebook Technologies, LLC, Menlo Park, CA (US)

(72) Inventor: Rajendra D. Pendse, Fremont, CA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/787,542

(22) Filed: Feb. 11, 2020

(65) Prior Publication Data
US 2020/0266180 A1    Aug. 20, 2020

Related U.S. Application Data

(60) Provisional application No. 62/805,948, filed on Feb. 14, 2019, provisional application No. 62/827,407, filed on Apr. 1, 2019.

(51) Int. Cl.
*H01L 25/16*        (2006.01)
*H01L 23/00*        (2006.01)
(Continued)

(52) U.S. Cl.
CPC .......... *H01L 25/167* (2013.01); *H01L 23/481* (2013.01); *H01L 24/05* (2013.01); *H01L 24/16* (2013.01); *H01L 24/24* (2013.01); *H01L 25/0753* (2013.01); *H01L 33/62* (2013.01); *H01L 2224/02372* (2013.01); *H01L 2224/02379* (2013.01); *H01L 2224/05* (2013.01); *H01L 2224/05025* (2013.01); *H01L 2224/16* (2013.01); *H01L 2224/16146* (2013.01);
(Continued)

(58) Field of Classification Search
CPC combination set(s) only.
See application file for complete search history.

(56) References Cited

U.S. PATENT DOCUMENTS 9,355,962 B2 *  5/2016  Lee ................ H01L 25/105
10,884,560 B2 *  1/2021  Pan ................ H01L 33/62
(Continued)

FOREIGN PATENT DOCUMENTS

CN       108877663 A       11/2018
WO     20170037529 A1      3/2017

OTHER PUBLICATIONS

PCT/US2020/018030, "International Search Report and Written Opinion", dated Jul. 20, 2020, 11 pages.

*Primary Examiner* — Mamadou L Diallo
(74) *Attorney, Agent, or Firm* — Weaver Austin Villeneuve & Sampson LLP

(57) ABSTRACT

An IC chip comprises LED devices exposed on a front side of the IC chip, I/O bumps on a back side of the IC chip, a first die forming a stack with the LED devices and comprising driver circuits electrically connected to the LED devices, a first circuit that extends along the vertical direction from the front side of the IC chip towards a back side of the IC chip and across at least a thickness of the first die to provide electrical connections between the LED devices and at least some of the I/O bumps, a second die including pipelining circuits and control circuits for the driver circuits, a second circuit that extends from the second die, and a circuit board electrically connected to the I/O bumps and to a power system.

33 Claims, 14 Drawing Sheets

(51) Int. Cl.
*H01L 23/48* (2006.01)
*H01L 25/075* (2006.01)
*H01L 33/62* (2010.01)

(52) U.S. Cl.
CPC .............. *H01L 2224/16225* (2013.01); *H01L 2224/24* (2013.01); *H01L 2224/24137* (2013.01); *H01L 2924/12041* (2013.01); *H01L 2924/1426* (2013.01)

(56) References Cited

U.S. PATENT DOCUMENTS

| | | | |
|---|---|---|---|
| 10,902,769 B2* | 1/2021 | Pappas | H01L 25/167 |
| 2010/0224985 A1* | 9/2010 | Michael | H01L 24/92 |
| | | | 257/692 |
| 2014/0203457 A1* | 7/2014 | Kim | H01L 25/0657 |
| | | | 257/778 |
| 2016/0133547 A1* | 5/2016 | Navaja | H01L 25/0657 |
| | | | 257/676 |
| 2016/0240527 A1* | 8/2016 | Ramachandran | H01L 23/5389 |
| 2017/0038055 A1* | 2/2017 | Daniels | H01L 24/00 |
| 2018/0102085 A1 | 4/2018 | Pan | |
| 2019/0019915 A1* | 1/2019 | Banna | H01L 27/153 |
| 2019/0057932 A1* | 2/2019 | Wu | H01L 24/03 |
| 2019/0109063 A1* | 4/2019 | Chew | H01L 23/48 |
| 2020/0091608 A1* | 3/2020 | Alpman | H01Q 21/24 |
| 2020/0212012 A1* | 7/2020 | Meyers | H01L 21/568 |
| 2020/0343237 A1* | 10/2020 | Karp | H01L 23/3114 |

* cited by examiner

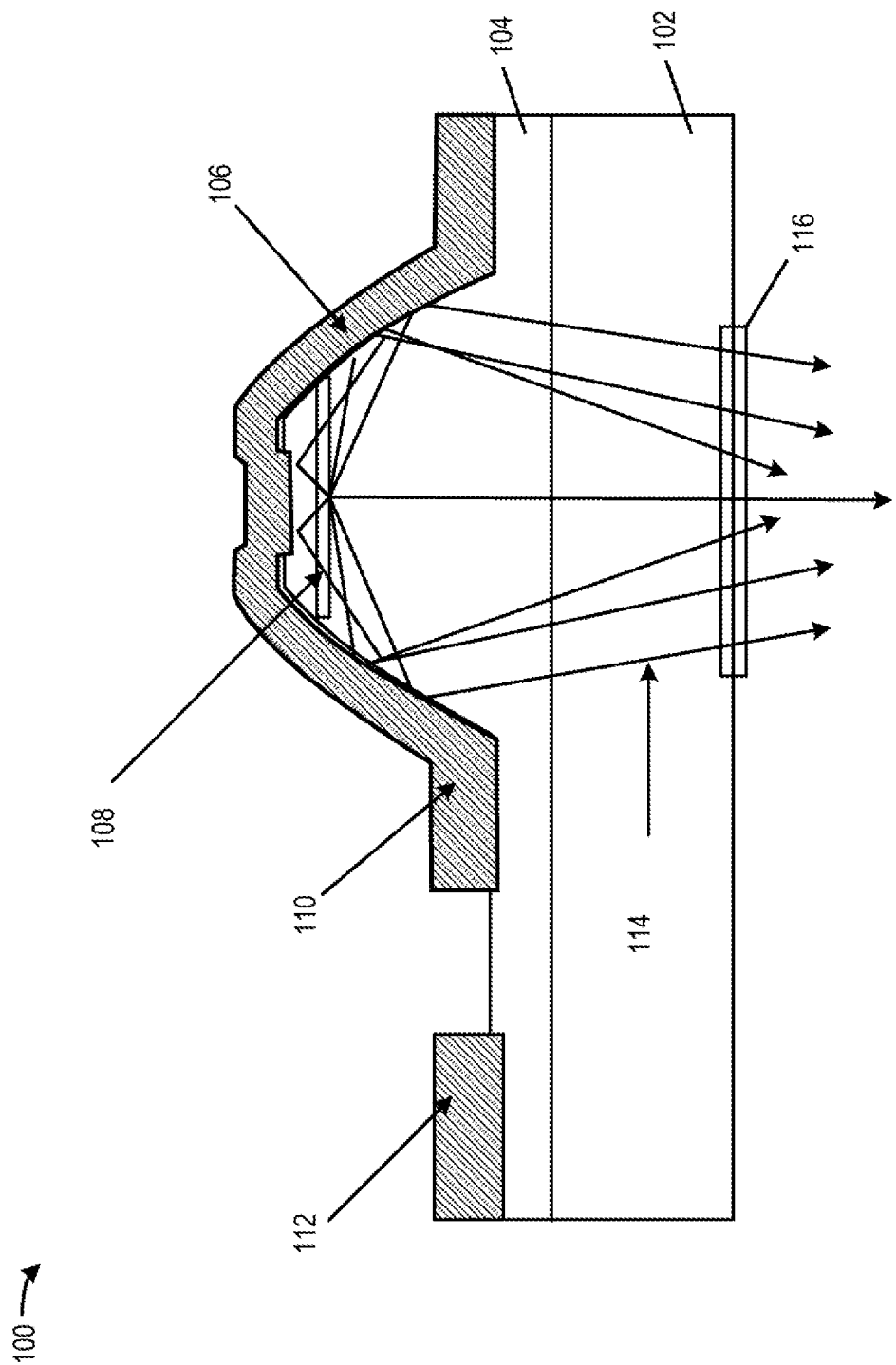

INTEGRATED DISPLAY DEVICES

CROSS-REFERENCE TO RELATED APPLICATIONS

This application claims the benefit of U.S. Provisional Application No. 62/805,948, filed Feb. 14, 2019, entitled "Integrated Display Devices" and U.S. Provisional Application No. 62/827,407, filed Apr. 1, 2019, entitled "Integrated Display Devices" which are incorporated herein by reference in their entirety.

BACKGROUND

The disclosure relates generally to display, and more specifically, to integration of display devices with control circuits.

Displays are ubiquitous and are a core component of wearable devices, smart phones, tablets, laptops, desktops, TVs and display systems. Common display technologies today include Light Emitting Diode (LED) displays.

A display system can be created by assembling an array of LED display devices on a backplane. One or more LED display devices of the array of LED display devices can be grouped to form pixels. The display system may include control circuits to generate control signals to control each pixel to display an image. The display system further includes a backplane to provide structural support for the LED display devices, and to provide electrical connections to transmit the control signals to the LED display devices. The integration of the LED display devices with the backplane and with the control circuits can affect the pixel-level interconnects as well as the size of the display system, all of which can affect the performance and the application of the display system.

SUMMARY

Methods and apparatuses are presented relating to an integrated circuit (IC) chip comprising light emitting diode (LED) devices exposed on a front side of the IC chip, input/output (I/O) bumps on a back side of the IC chip, a first die forming a stack with the LED devices along a vertical direction, the first die comprising driver circuits electrically connected to the LED devices and electrically connected to at least some of the I/O bumps, a first circuit that extends along the vertical direction from the front side of the IC chip towards the back side of the IC chip and across at least a thickness of the first die to provide electrical connections between the LED devices and at least some of the I/O bumps, a second die including pipelining circuits and control circuits for the driver circuits of the first die and electrically connected to at least some of the I/O bumps, a second circuit that extends from the second die to the first die to provide electrical connections between the first die and the second die, and a circuit board electrically connected to the I/O bumps of the IC chip and to a power system to provide electrical connections between the power system and each of the first die, the second die, and the LED devices of the IC chip.

In some embodiments, the first die is positioned adjacent to the second die along a lateral direction within the IC chip, the lateral direction being perpendicular to the vertical direction. The IC chip may include a shoulder structure abutting the first die along the lateral direction, and the first circuit may comprise electrical conduction paths that extend through the shoulder structure along the vertical direction. The IC chip may include a redistribution layer (RDL) adjacent to the LED devices along the lateral direction, and the RDL may extend over at least a part of the shoulder structure and at least a part of the first die to provide electrical connections between the first die and the first circuit. In some instances, the first die comprises an inner layer circuit to electrically connect between the LED devices and the RDL. Furthermore, the IC chip may include a shoulder structure abutting the second die along the lateral direction, and the first circuit may comprise electrical conduction paths that extend through the shoulder structure along the vertical direction. The IC chip may include, as part of the second circuit, an RDL adjacent to the LED devices along the lateral direction. The RDL may extend over at least a part of the shoulder structure, the second die, and at least a part of the first die to provide electrical connections between the first die and the first circuit and between the first die and the second die. In some instances, the first die comprises an inner layer circuit to provide electrical connections between the LED devices and I/O bumps on the front side of the IC chip.

The I/O bumps on the back side of the IC may comprise I/O bumps formed on the shoulder structure and electrically connected to the electrical conduction paths of the shoulder structure. In one embodiment, the RDL is a first RDL, and the IC chip further comprises a second RDL, the second RDL covering at least a part of a second shoulder structure abutting the second die along the lateral direction, the first die, and the second die to provide electrical connections to the first circuit, the first die, and the second die. Here, the I/O bumps on the back side of the IC may comprise I/O bumps formed on the second shoulder structure and electrically connected to electrical conduction paths of the second shoulder structure.

In certain instances, the shoulder structure is formed to abut the first die when the first die is on a carrier substrate. In some cases, the shoulder structure includes an epoxy molding compound (EMC). Just as an example, the shoulder structure may be formed by filling a mold with the EMC. The electrical conduction paths may include copper as a material. In certain instances, the IC chip includes a chip carrier to hold both the first die and the second die. Here, the first circuit may comprise electrical conduction paths that extend through the chip carrier along the vertical direction to reach the I/O bumps on the back side of the IC chip. In some cases, the IC chip includes a first bridge circuit that extends over a part of the chip carrier and a part of the first die to provide electrical connections between the first circuit and the first die. Here, the first die may further include an inner layer circuit to provide electrical connections between the first circuit and the LED devices. In some cases, the IC chip includes, as part of the second circuit, a second bridge circuit that extends over a part of the first die and a part of the second die to provide electrical connections between the first die and the second die. The chip carrier may comprise, for example, a ceramic material.

In some embodiments, the first die forms a stack with the second die along the vertical direction within the IC chip. In one particular embodiment, the IC chip further comprises a first shoulder structure abutting the first die along a lateral direction perpendicular to the vertical direction and a second shoulder structure abutting the second die along the lateral direction. Here, the first circuit may comprise first electrical conduction paths that extend through the first shoulder structure along the vertical direction and second electrical conduction paths that extend through the second shoulder structure along the vertical direction. The IC chip may include a first RDL adjacent to the LED devices and extending over at least a part of the first shoulder structure and a part of the first die to provide electrical connections between the first die and the first electrical conduction paths, as well as a second RDL facing the first die and extending over at least a part of the second shoulder structure and a part of the second die to provide electrical connections between the second die and the second electrical conduction paths. The first RDL and the second RDL may be part of the second circuit. The IC chip may further comprise I/O bumps between the first shoulder structure and the second shoulder structure to provide electrical connections between the first electrical conduction paths and the second electrical conduction paths. The IC chip may further comprise a third RDL that extends over a part of the first shoulder structure and a part of the first die. The third RDL may be electrically connected to the first electrical conduction paths of the first should structure and facing the second RDL. The IC chip may also further comprise I/O bumps sandwiched between the third RDL and the second RDL to provide electrical connections between the third RDL and the second RDL. The I/O bumps on the back side of the IC chip may comprise I/O bumps on the second shoulder structure and electrically connected to the second electrical conduction paths of the second shoulder structure.

In one particular embodiment of the first die and second die forming a stack, the first die comprises, as part of the first circuit, a plurality of first through silicon vias (TSVs) electrically connected to the LED devices, and the second die comprises, as part of the first circuit, a plurality of second TSVs electrically connected to the plurality of first TSVs. The I/O bumps on the back side of the IC chip may be electrically connected to the plurality of second TSVs. The second die may comprise, as part of the second circuit, a plurality of third TSVs electrically connected to the first die. Here, the plurality of first TSVs may be formed in a peripheral area of the first die. The peripheral area may be outside a pixel area of the first die on which the LED devices are formed.

In a different embodiment of the first die and second die forming a stack, the first die once again comprises, as part of the first circuit, TSVs electrically connected to the LED devices and formed in a peripheral area of the first die. As before, the peripheral area outside may be a pixel area of the first die on which the LED devices are formed. But here, the display apparatus further includes, as part of the first circuit, electrical conduction paths that extend through a shoulder structure, the shoulder structure abutting the second die along the lateral direction.

The first die may be fabricated from a first wafer, and the second die may be fabricated from a second wafer. The first wafer and the second wafer may be associated with at least one of: different operating voltages or different process nodes.

A method for manufacturing an IC chip described above may comprise fabricating light emitting diode (LED) devices, fabricating a first die from a first wafer to include driver circuits in the first die, transferring the LED devices onto the first die, fabricating a second die from a second wafer, packaging the first die and the second die to form an integrated circuit (IC) chip, the LED devices being exposed on a front side of the IC chip, fabricating a first circuit that extends along the vertical direction from the front side of the IC chip towards a back side of the IC chip across the first die to provide electrical connections to the LED devices, fabricating a second circuit to provide electrical connection between the first die and the second die, forming input/output (I/O) bumps on the back side of the IC chip to provide electrical connections to the first die, the second die, and to the first circuit, and connecting the IC chip to a circuit board via the I/O bumps to form a display apparatus. For example, the first circuit may comprise through silicon vias (TSV). The TSVs may be fabricated by etching through a first surface of the first die after the LED devices are transferred onto the first surface of the first die that includes the driver circuits.

BRIEF DESCRIPTION OF THE DRAWINGS

Illustrative embodiments are described with reference to the following figures:

FIG. 1 shows a cross-sectional view of an example LED device that can be manufactured using examples of the disclosed techniques.

Figure 2A:
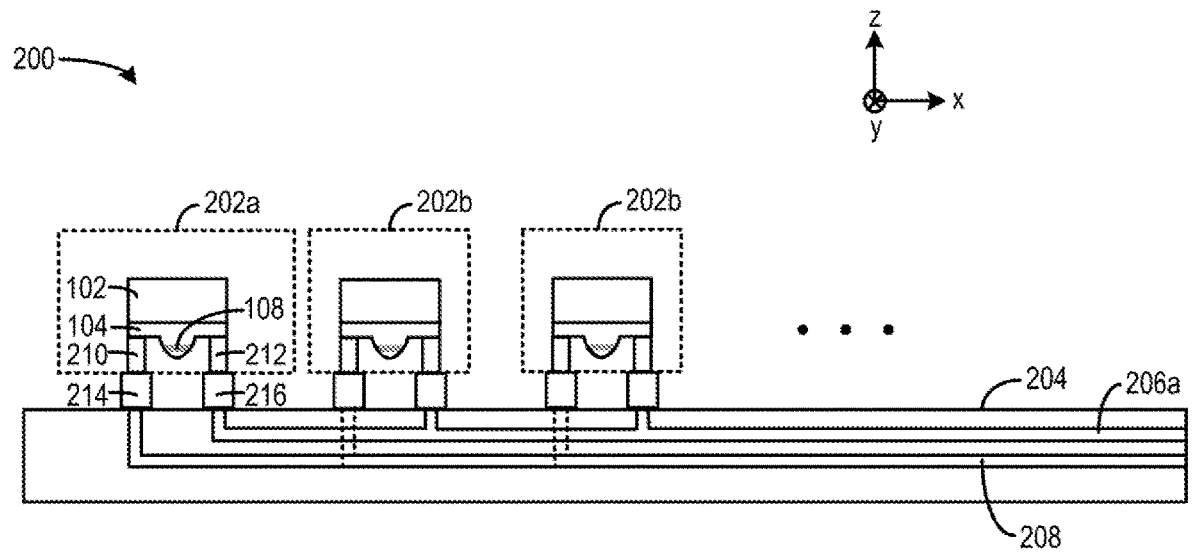
FIG. 2A, FIG. 2B, FIG. 2C, and FIG. 2D are schematic views of an example display that can be manufactured using examples of the disclosed techniques.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "µLED,"

"uLED," or "MicroLED," described herein refers to a particular type of ILED having a small active light emitting area (e.g., less than 2,000 µm²) and, in some examples, being capable of generating directional light to increase the brightness level of light emitted from the small active light emitting area. In some examples, a micro-LED may refer to an LED that has an active light emitting area that is less than 50 µm, less than 20 µm, or less than 10 µm. In some examples, the linear dimension may be as small as 2 µm or 4 µm. For the rest of the disclosure, "LED" may refer µLED, ILED, OLED, or any type of LED devices.

ILED displays can be manufactured using different processes from OLED displays. For example, OLED devices are fabricated directly onto a display substrate. In contrast, ILED devices are fabricated separately from the display substrate. The base material of ILED devices base material is grown on a crystalline substrate to form an LED starter wafer. The LED starter wafer can be processed through various steps to produce individual LED dies, with each LED die including an LED device. Once fabricated, the LED dies can be transferred from the carrier substrate to a backplane. The backplane can be a display backplane of a display device. The LED devices of the display device can be divided to form pixels.

The backplane, as well as other components such as control circuits and power system can be individually attached to a circuit board (e.g., a printed circuit board (PCB)) to form a display system. The circuit board can provide electrical connections among the different components of the display system. Such arrangements can be undesirable. First, as the components are spaced apart by relatively long distances, the form factor of the display system increases, which makes it difficult to deploy the display system in devices with very limited spaces, such as a wearable device. Second, long signal traces are needed to provide the electrical connections among the components. The long signal traces can add substantial delay to the transmission of high speed signals, such as high resolution image data, which can significantly degrade the performance of the display system. All these can limit the applications of the display system.

Examples of the present disclosure provide a display apparatus. The display apparatus comprises an integrated circuit (IC) chip. The IC chip comprises light emitting diode (LED) devices, a first die, and a second die integrated within the IC chip. The LED devices are exposed on a front side of the IC chip. The IC chip further includes input/output (I/O) bumps on a back side of the IC chip. The LED devices can form a stack with the first die along a vertical direction. The first die includes driver circuits electrically connected to the LED devices and is electrically connected to at least some of the I/O bumps. The IC chip further includes a first circuit that extends along the vertical direction from the front side of the IC chip towards the back side of the IC chip and across at least a thickness of the first die to provide electrical connections between the LED devices and at least some of the I/O bumps. The second die, which comprises a display engine and control circuits for the driver circuits of the first die, is connected to at least some of the I/O bumps. The IC chip further includes a second circuit to provide electrical connections between the first die and the second die. The display apparatus further comprises a circuit board electrically connected to the I/O bumps of the IC chip and to a power system to provide electrical connections between the power system and each of the first die, the second die, and the LED devices of the IC chip.

The present disclosure refers to components or circuits that are "electrically connected." Here, "electrically connected" broadly refers to one or more electrical connections that may be formed directly between two components, or indirectly through one or more intervening components, paths, or circuits. In the present disclosure, a "circuit" can include any structure that can conduct an electrical current or can transmit an electrical potential. A circuit can include, for example, a wire, a via, as well as any passive or active devices (e.g., a resistor, a capacitor, an inductor, a transistor, etc.).

In some examples, the first die and the second die can be arranged along a lateral direction within the IC chip. The IC chip may include a shoulder structure abutting the first die along the lateral direction. The shoulder structure may include electrical conduction paths that extend across the shoulder structure from the front side of the IC chip to the back side of the IC chip to provide electrical connections between the LED devices and the I/O bumps. The IC chip may include fan-out circuits configured as a front side redistribution layer (RDL) adjacent to the LED devices and on the front side of the IC chip. The front side RDL can extend from the shoulder structure to the first die to provide electrical connections between a first end of the electrical conduction paths and the first die. The first die further includes an inner layer circuit to provide electrical connection between the first end of the electrical conduction paths and the LED devices. The IC chip may also include another front side RDL that extends from the second die over to the first die to provide electrical connections between the first die and the second die.

Various configurations are proposed to connect a second end of the electrical paths of the shoulder structure to the I/O bumps on the back side of the IC chip. In one example, the I/O bumps can be formed on part of the shoulder structure on the back side of the IC chip to electrically connect to the second end of the electrical conduction paths. In another example, the IC chip may include fan-out circuits configured as a back side RDL opposite to the front side RDL. The I/O bumps can be formed on the backside RDL, and the backside RDL can extend from the I/O bumps to the shoulder structure to provide electrical connections between the I/O bumps and the second end of the electrical conduction paths.

In some examples, the first die and the second die can form a stack along the vertical direction within the IC chip. The IC chip may include a first shoulder structure abutting the first die along the lateral direction and a second shoulder structure abutting the second die along the lateral direction. The first shoulder structure may include first electrical conduction paths that extend across the first shoulder structure along the vertical direction. The second shoulder structure may include second electrical conduction paths that extend across the second shoulder structure along the vertical direction. The first die may include a first front side RDL adjacent to the LED devices. The first front side RDL extends from the first shoulder structure to the first die to provide electrical connections between the LED devices and the first electrical conduction paths via the first die. In some examples, the first shoulder structure in the first die may be replaced by through silicon vias (TSVs) within the body of the first die itself. The TSVs may be in the perimeter region of the first die or within substantially an entire area of the first die.

Various configurations are proposed to provide electrical connections between the first shoulder structure and the second shoulder structure. In one example, the first electrical conduction paths and the second electrical conduction paths can be electrically connected together via I/O bumps sandwiched between the first shoulder structure and the second shoulder structure. In some examples, the IC chip may include opposite RDL layers formed on, respectively, a backside of the first die (facing away from the front side of the IC chip) and a front side of the second die facing the backside of the first die. The opposite RDL layers can extend to, respectively, the first shoulder structure and the second shoulder structure to provide electrically connections to, respectively, the first electrical conduction paths of the first shoulder structure and the second electrical conduction paths of the second shoulder structure. The IC chip may include I/O bumps sandwiched between the opposite RDL layers to provide electrical connections between the opposite RDL layers and between the first electrical conduction paths and the second electrical conduction paths. The I/O bumps on the back side of the IC chip can be located on the second shoulder structure, or on another backside RDL that extends over the second chip, as described above.

Other configurations are also proposed to integrate the LED devices and the dies in an integrated circuit chip. In one example, the IC chip may include a chip carrier to hold the first die and the second die arranged along the lateral direction. The chip carrier may include electrical conduction paths to provide electrical connections to the I/O bumps on the back side of the IC chip. The IC chip may include bridge circuits to provide electrical connections between the LED devices and the electrical conduction paths within the chip carrier. In another example, the IC chip may include the first die and the second die forming a stack along the vertical direction, and each of the first die and the second die may include through silicon vias (TSVs) to provide electrical connections between the LED devices and the I/O bumps on the back side.

With the disclosed techniques, the LED devices and the control circuits can be integrated in a single integrated circuit chip. Such arrangements can substantially reduce the separation distances between the components of a display system, which reduces not only the form factor of the display system but also the routing distances, and the operation speed of the display system can be improved as a result. The disclosed techniques are particularly advantageous for implementation of a high performance display system in a wearable device (e.g., a head mount display) which has very limited space.

Examples of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HIVID) connected to a host computer system, a standalone HIVID, a mobile device or computing system, or any other hardware platform capable of providing artificial reality content to one or more viewers.

FIG. 1 shows a cross-sectional view of a μLED 100 according to some examples of the present disclosure. As shown in FIG. 1, μLED 100 includes, among others, a substrate 102, a semiconductor epitaxial layer 104 disposed on the substrate 102. Epitaxial layer 104 can be shaped into a mesa 106. an active layer 108, which can include quantum well structures configured to emit light of a pre-determined wavelength range when activated, can be included in mesa 106. Mesa 106 has a truncated top covered by a P-type contact pad 110, whereas a part of epitaxial layer 104 outside of mesa 106 may be covered by an N-type contact pad 112. An electric signal can be applied across P-type contact pad 110 and N-type contact pad 112 to activate active layer 108 to emit light 114. Moreover, mesa 106 also has a near-parabolic shape to form a reflective enclosure. The near-parabolic structure of mesa 106 can be etched directly onto the LED die during the wafer processing steps. Mesa 106 for a typical μLED can have a diameter of about 50 micrometers (μm) or less, whereas each of P-type contact pad 110 and N-type contact pad 112 may have a diameter of about 20 μm.

Light 114 emitted from active layer 108 can be reflected off the internal walls of mesa 106 toward light emitting surface 116 at an angle sufficient for the light to escape the μLED die 100 (i.e., within an angle of total internal reflection). Light 114 can form a quasi-collimated light beam as the light emerges from light emitting surface 116.

Figure 2B:
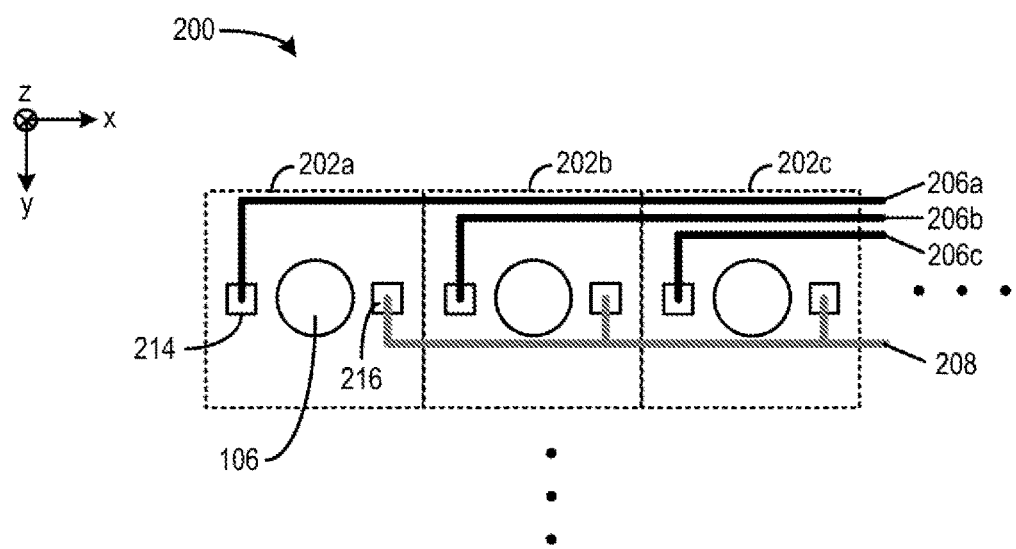

FIG. 2A and FIG. 2B show an example of a μLED display apparatus 200 according to some examples of the present disclosure. Although the examples of FIG. 2A and FIG. 2B are based on μLED devices, it is understood that the examples of FIG. 2A and FIG. 2B are applicable to other types of LED devices as well. FIG. 2A shows a cross-sectional view of the display apparatus, whereas FIG. 2B shows a top view of the display apparatus. As shown in FIG. 2A, μLED display 200 can include an array of μLED dies 202 including, for example, μLED die 202a, μLED die 202b, and μLED die 202c assembled on a backplane 204.

Backplane 204 may include a structure for attaching a plurality of μLED dies, to provide electrical connections and structural support for the plurality of μLED devices. As used herein, "backplane" may refer to any structure that provides a surface (which can be planar, curved, etc.) for attaching a plurality of LED devices (which may include μLED devices as described in this disclosure) and for providing electrical signals to the plurality of LED devices. The backplane can be configured as a display backplane to form a display device. For example, the backplane can hold assemblies of LED devices forming display elements, and the backplane may also include traces to provide electrical signals to the LED devices to control the information displayed by the display elements. Backplane 204 may comprise traces, which may connect to other components. Backplane may also comprise electrical contact points, e.g., metal pads, which may provide access to the traces. For example, as shown in FIG. 2A and FIG. 2B, backplane 204 includes electrical traces 206a, 206b, and 206c to electrically connect with, respectively, μLED die 202a, μLED die 202b, and μLED die 202c. Electrical traces 206a, 206b, and 206c allow each of μLED die 202a, μLED die 202b, and μLED die 202c to be individually controlled by applying different signals. Backplane 204 also includes an electrical trace 208 to act as a return current path for each of μLED die 202a, μLED die 202b, and μLED die 202c. Backplane 204 may include different kinds of materials, such as Thin Film Transistor (TFT) glass substrate, polymer, polychlorinated biphenyl (PCB). etc. Although FIG. 2A illustrates that backplane 204 has a rectangular shape, it is understood that backplane 204 can have various shapes and sizes.

Each of μLED die 202a, μLED die 202b, and μLED die 202c can have a structure similar to μLED die 100 of FIG. 1. Each μLED die in FIG. 2A and FIG. 2B may include substrate 102, epitaxial layer 104, mesa 106, and active layer 108. In addition, each μLED die includes a device-side bump 210 and a device-side bump 212. While FIG. 2A and FIG. 2B illustrate that the bumps are of rectangular shape, it is understood that the bumps can take on other shapes including, for example, rounded shapes, dome shapes, etc. Device-side bump 210 can be connected to P-type contact pad 110 (not shown in FIG. 2A and FIG. 2B), whereas device-side bump 212 can be connected to N-type contact pad 112 (also not shown in FIG. 2A and FIG. 2B). Moreover, backplane 204 includes backplane-side bumps at each location for placing a μLED die. For example, backplane 204 includes backplane-side bumps 214 and 216 for μLED die 202a. Backplane 204 also includes metal pads (not shown in FIG. 2A) which serve as a foundation on which backplane-side bumps 214 and 216 are deposited, and to provide electrical contact to traces 206 and 208. Conductive bonding (e.g., metallic bonding) can be formed between the bumps of the μLED dies and the contacts to provide electrical paths between the μLED die and backplane 204.

Figure 2C:
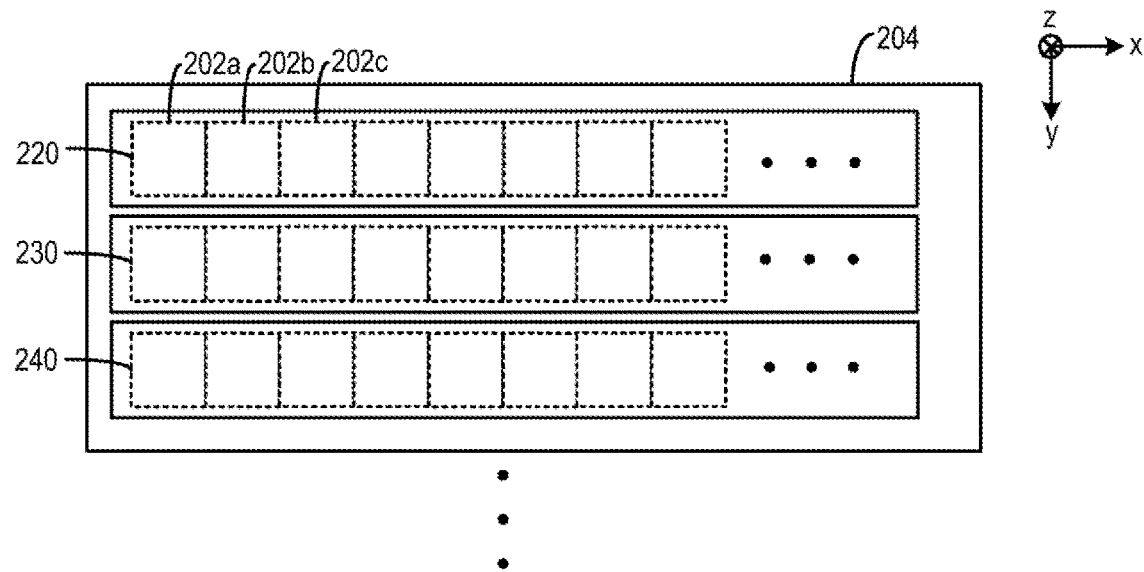
Figure 2D:
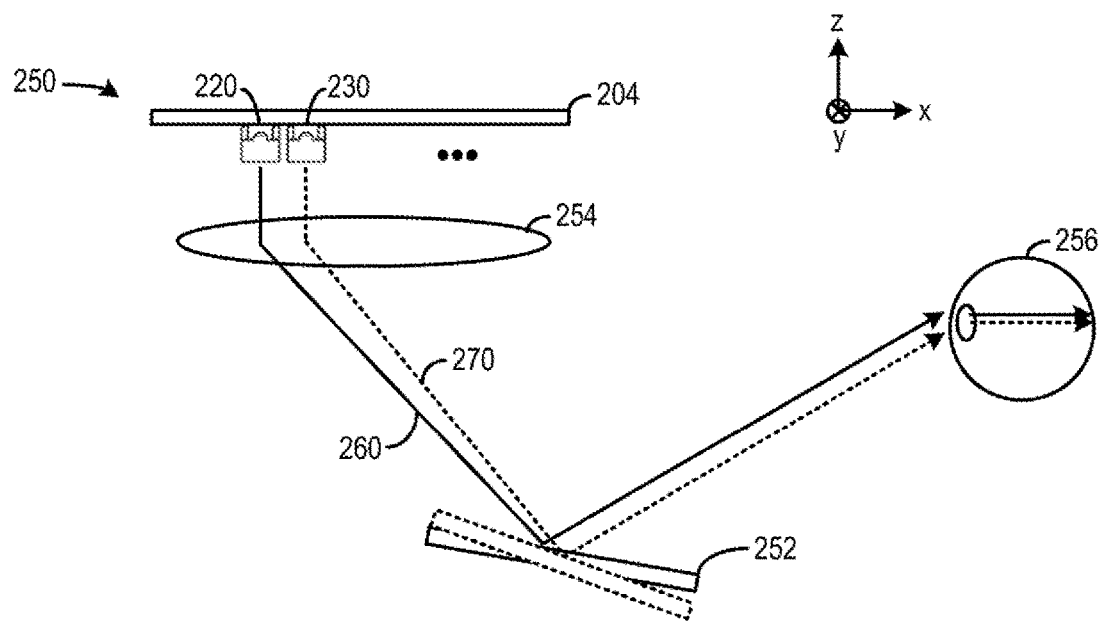

In some examples, μLED display apparatus 200 can be configured as a scanning display in which the LEDs configured to emit light of a particular color are formed as a strip (or multiple strips). For example, as shown in FIG. 2C, a plurality of μLED dies including μLED die 202a, μLED die 202b, and μLED die 202c, etc. can be assembled along an X-axis to form a μLED strip 220 configured to emit green light on backplane 204. In addition, backplane 204 also includes a μLED strip 230 configured to emit red light and an LED strip 240 configured to emit blue light.

μLED strips 220, 230, and 240, as well as additional strips of red, green and blue μLEDs, can be assembled along a Y-axis as parallel strips on backplane 204 to form a scanning display. FIG. 2D illustrates an example of a scanning display 250 comprising μLED display apparatus 200, a mirror 252, and a lens 254. In scanning display 250, each strip of LEDs can be configured to emit light of a particular color (e.g., one of red, green, or blue). For example, μLED strip 220 can emit green light 260, μLED strip 230 can emit red light 270, etc. The lights can be converged by lens 254 and reflected by mirror 252 into eyeball 256 of a person. To perform sequential scanning, each strip of μLEDs can be controlled to emit light to project a line of pixels of an image onto the retina of eyeball 256. The projection of each line of pixels can be sequential. Through the rotating action of mirror 252, each line of pixels can be projected at different points at different times on the retina, to create the perception of the image.

In the examples of FIG. 2A-FIG. 2D, backplane 204 has backplane-side bumps for each μLED to transmit control signals to each μLED. Such arrangement, while allowing each μLED to be individually controlled, can lead to a large number of backplane-side bumps being placed on the backplane when the display includes a large number of pixels to improve resolution. For example, if scanning display 250 includes one million μLEDs, one million pairs of backside-bumps 214 and 216 need to be provided on backplane 204 to provide electrical connections to each of the one million μLEDs. Additional wirings 206 and 208 are also needed on backplane 204 to provide electrical connections to the backside-bumps.

The large number of bumps and the associated wirings can degrade the tight integration between the LED devices and the control circuits. For example, additional backplane spaces may be needed to place the bumps, which can increase the distances between the LED devices and the control circuits. As signals need to travel through longer distances, the operation speeds of both the LED devices and the control circuits can be reduced as a result.

Figure 3:
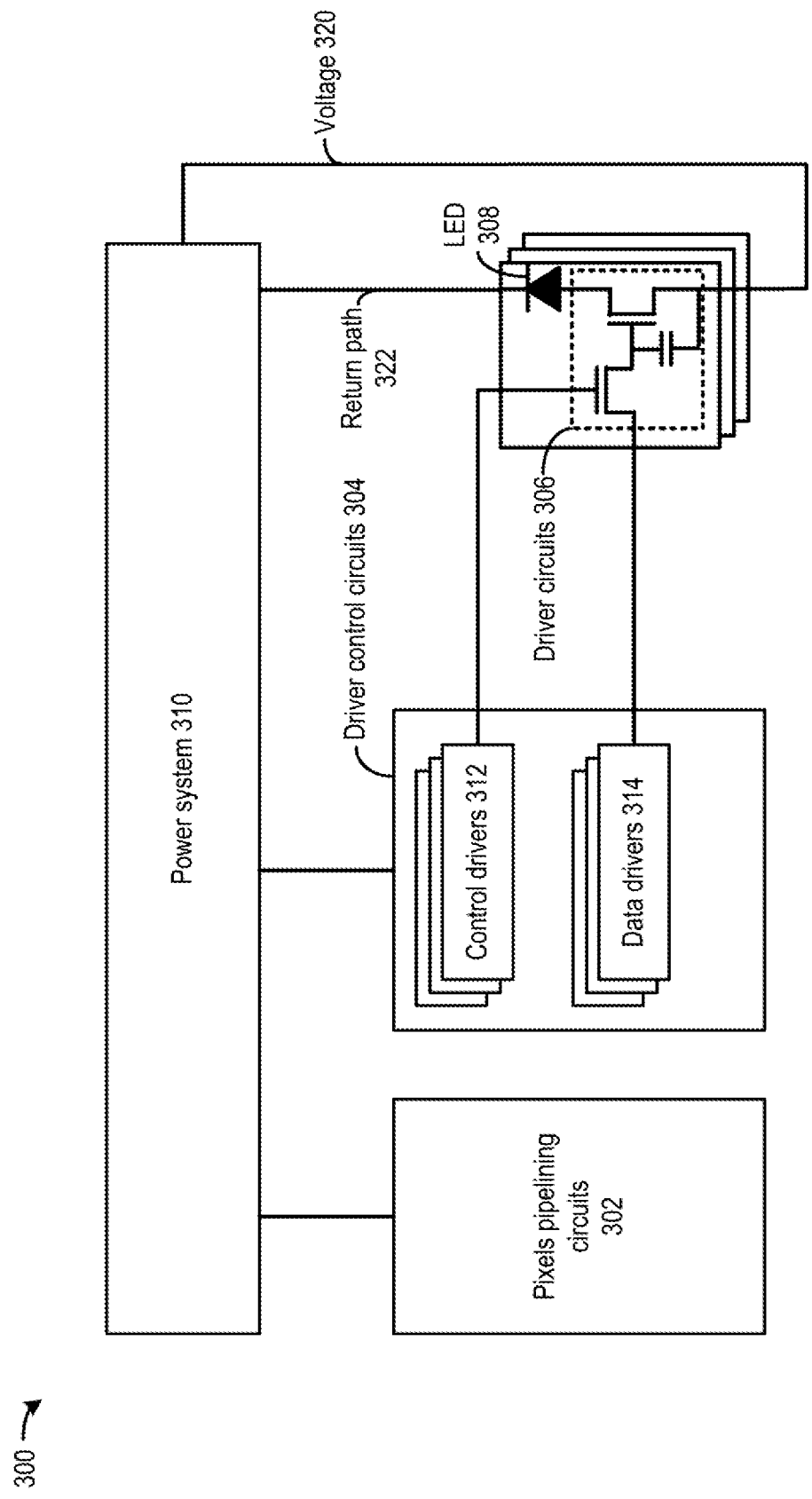
FIG. 3 illustrates an example of a display device, according to examples of the disclosed techniques.

FIG. 3 illustrates an example of a display system 300 that can be part of or include μLED display apparatus 200. As shown in FIG. 3, display system 300 includes pixel pipelining circuits 302, driver control circuits 304, driver circuits 306, an array of uLED devices 308, and power system 310. Pixel pipelining circuits 302 can generate pixel data to be rendered by display system 300. Pixel data can include, for example, an image of a virtual reality scene, a composite image of a mixed reality scene, an image captured by a camera, etc. Driver control circuits 304 can generate control signals and data signals for driver circuits 306 based on the pixel data. The control signals can include, for example, address signals to select a uLED device among the array of uLED devices 308. The data signals can set an output intensity of the selected uLED device. Both address signals and data signals can be high speed signals to allow display system 300 to display images at a high resolution and at a high refresh rate. Typically both pixel pipelining circuits 302 and driver control circuits 304 are fabricated using process technologies that support high speed operations and relatively low operation voltages.

In addition, As shown in FIG. 3, driver circuits 306 may include a set of control drivers 312 to provide the control signals and a set of data drivers 314 to provide the data signals. Driver circuits 306 can receive the address and data signals from driver control circuits 304 and control the output intensities of the uLED devices based on, for example, controlling the currents that flow through the uLED devices based on the data signals. As shown in FIG. 3, driver circuits 306 may include transistors and capacitors controlled by the control signals and data signals to control the flow of current in the uLED devices. Typically driver circuits 306 are fabricated using process technologies that support high operation voltages and relatively low speed operations.

Power system 310 may include a power supply circuit (e.g., a voltage regulator), as well as other elements (e.g., voltage supply line, ground line, etc.). As shown in FIG. 3, power system 310 can be electrically connected to each of pixel pipelining circuits 302, driver control circuits 304, and driver circuits 306, to, for example, supply electric power (e.g., voltage 320) and/or provide a current return path. Power system 310 also provides a return path 322 for uLED devices 308.

As described above, it is advantageous to integrate pixel pipelining circuits 302, driver control circuits 304, driver circuits 306, and uLED devices 308 within a single integrated circuit chip to reduce the separation distances between these components. Such arrangements can reduce the form factor of the display system as well as the routing distances and improves the operation speed of the display system.

Figure 4A:
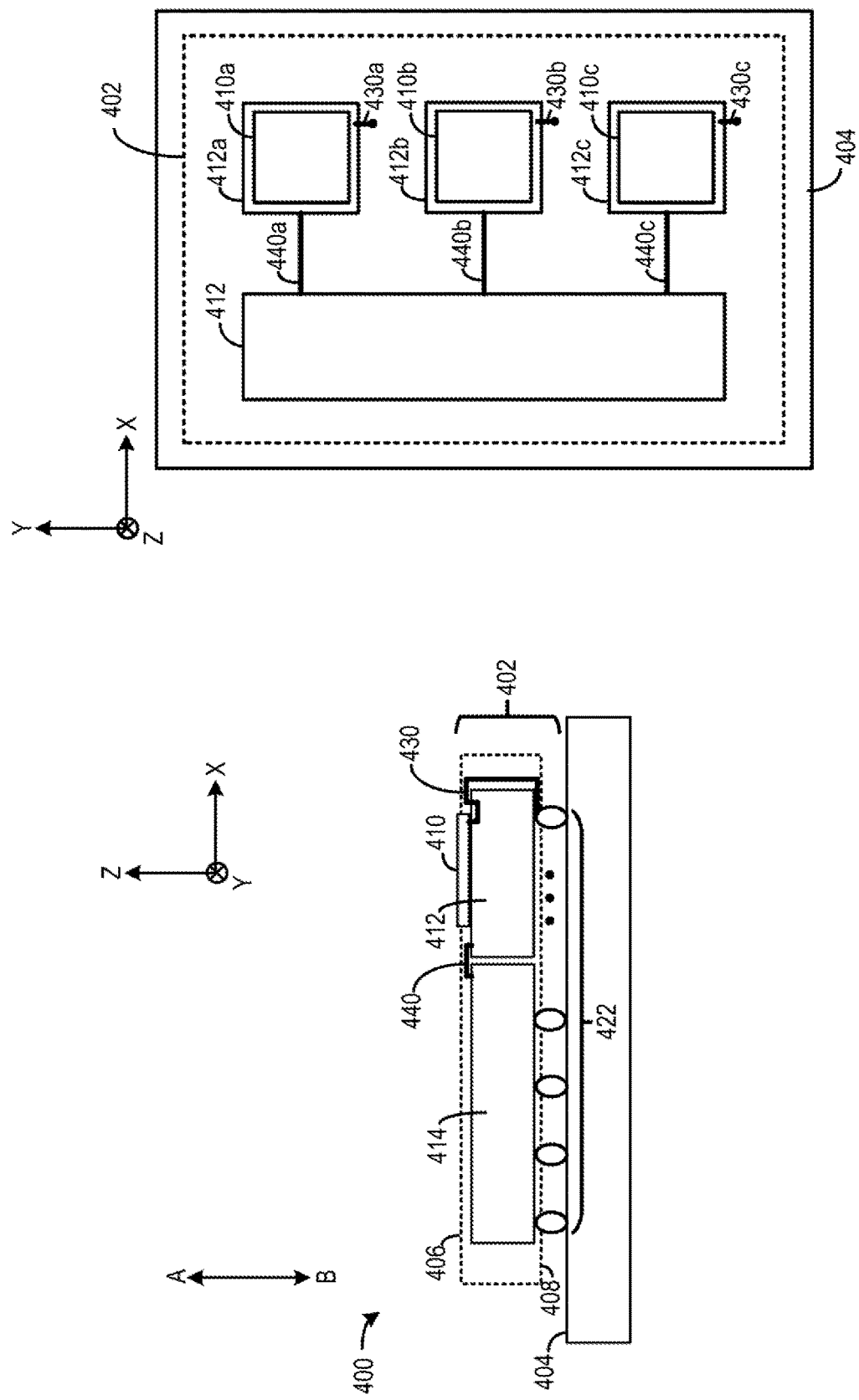
FIG. 4A and FIG. 4B illustrate examples of the display device of FIG. 3, according to examples of the disclosed techniques.
Figure 4B:
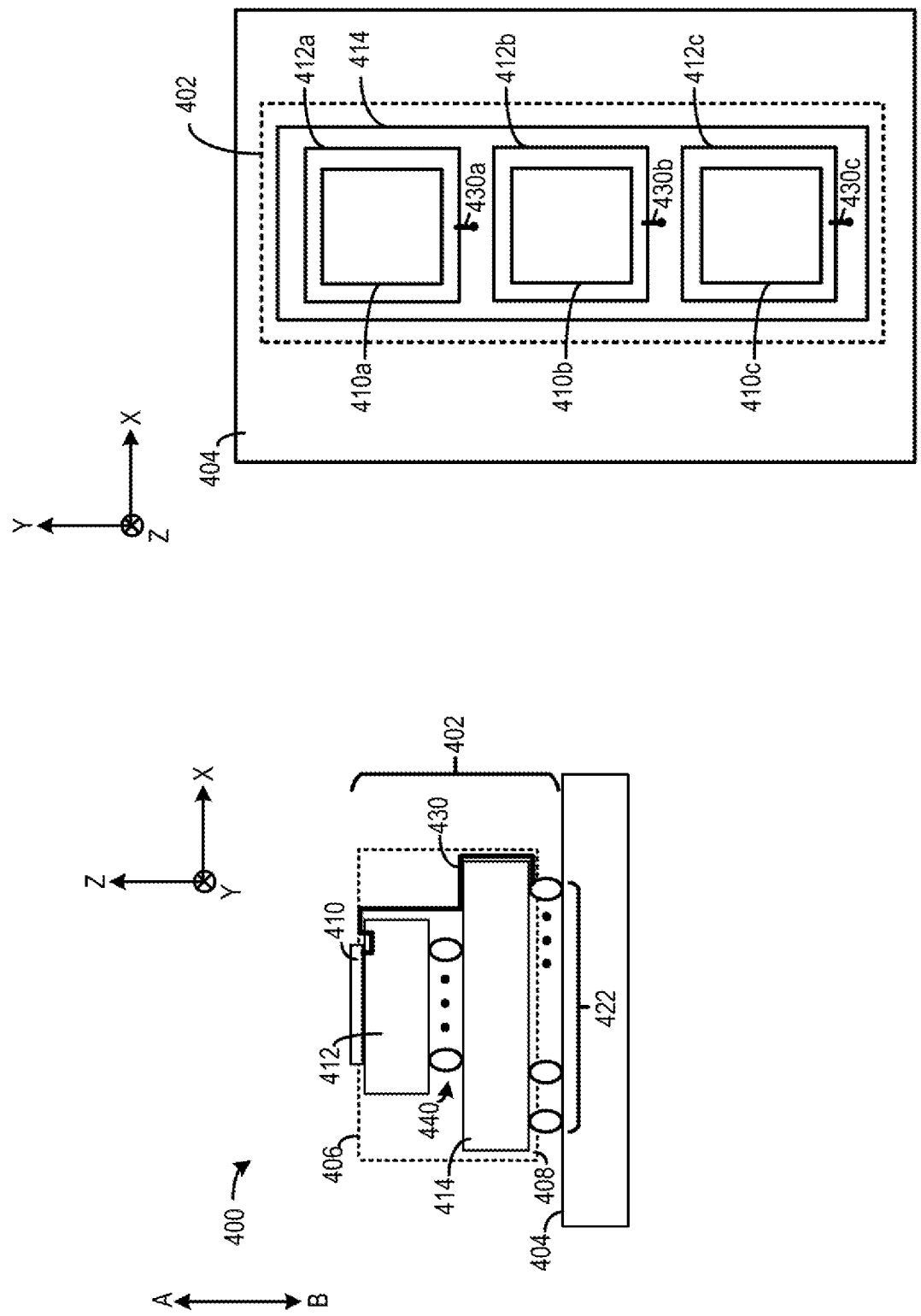

FIG. 4A and FIG. 4B illustrate example of a display system 400 that can provide improved performance and reduced form factors. The left diagram of FIG. 4A illustrates a side view of an example of a display system 400, whereas the right diagram of FIG. 4A illustrates a top view of display system 400. Referring to FIG. 4A, a display system 400 can include an integrated circuit (IC) chip 402 and a circuit board 404. Integrated circuit chip 402 includes a front side 406 (facing towards direction "A") and a back side 408 (facing towards direction "B"). IC chip 402 includes light emitting diode (LED) devices 410, a first die 412, and a second die 414 integrated within IC chip 402. LED devices 410 are exposed on the front side of the IC chip. IC chip 402 further includes input/output (I/O) bumps 422 on back side 408. LED devices 410 can form a stack with first die 412 along a vertical direction (e.g., along the Z axis). First die 412 can include, for example, driver circuits 306 of FIG. 3. Driver circuits 306 can be electrically connected to some of I/O bumps 422. As shown on the right of FIG. 4A, IC chip 402 may include a plurality of first dies 412 coupled with LED devices 410 of different colors. For example, first die 412a can form a stack with red LED devices 410a, first die 412b can form a stack with green LED devices 410b, whereas first die 412c can form a stack with blue LED devices 410c. Second die 414 may include, for example, pixel pipelining circuits 302 and driver control circuits 304. Pixel pipelining circuits 302 and driver control circuits 304 can be connected to some of I/O bumps 422 as well. First die 412 and second die 414 can be fabricated from different wafers associated with, for example, different processing nodes, different operation voltages, etc. For example, first die 412 can be fabricated using a process node that tolerates higher operation voltage but supports lower speed operations, whereas second die 414 can be fabricated using a process node that supports higher speed operations but have lower operation voltage limits.

In addition, IC chip 402 includes a first circuit 430 and a second circuit 440. Both first circuit 430 and second circuit 440 may include wires, traces, vias, etc., to provide electrical connections. First circuit 430 (e.g., first circuits 430a, 430b, 430c, etc.) can extend along the vertical direction from front side 408 of IC chip 402 towards back side 408 of IC chip 402 and across at least a thickness of first die 412. That is, the vertical distance covered by first circuit 430 may span at least the thickness of first die 412. However, first circuit 430 may or may not actually physically go through the first die 412, depending on the embodiment adopted. For example, in the embodiment shown in FIG. 4A, first circuit 430 extends vertically across at least the thickness of first die 412, without physically going through first die 412. First circuit 430 can include an inner layer circuit in first die 412 to electrically connect to LED devices 410. First circuit 430 can be configured as a wrap-around circuit to provide electrical connections between LED devices 410 and at least some of I/O bumps 422. For example, first circuit 430 can be part of return/ground path 322 of FIG. 3. First circuit 430 can also provide power supply to, for example, driver circuits 306. Second circuit 440 (e.g., second circuits 440a, 440b, 440c, etc.) can extend from second die 414 to each of first dies 412a, 412b, and 412c. Second circuit 440 can provide electrical connections between second die 414 and each of first dies 412a, 412b, and 412c. The electrical connections can be used to, for example, transmit data and control signals from second die 414 to first dies 412a-412c, transmit other signals from I/O bumps 422 to first dies 412a-412c, etc.

Circuit board 404 can include traces and pads. Some of the pads of circuit board 404 can be electrically connected to I/O bumps 422 of IC chip 402, whereas some of the pads of circuit board 404 can be electrically connected to, for example, power system 310, or other components. Circuit board 404 can provide electrical connections between power system 310 and each of first die 412, second 414, and LED devices 410. For example, return/ground path 322 of FIG. 3 can be implemented via first circuit 430 and I/O bumps 422, as well as circuit board 404, between an uLED 308 and power system 310.

In the example of FIG. 4A, first die 412 and second die 414 are arranged along a lateral direction (e.g., along the X or Y axis) within IC chip 402. In some examples, as show in FIG. 4B, first die 412 and second die 414 can form a stack along the vertical direction, to further reduce the form factors of integrated circuit chip 402 and display system 400. As shown in FIG. 4A, first circuit 430 can extend along the vertical direction from front side 406 of IC chip 402 towards back side 408 of IC chip 402 and across a thickness of first die 412 and second die 414. In addition, a set of I/O bumps can be sandwiched between first die 412 and second die 414 as part of second circuit 440.

Figure 5A:
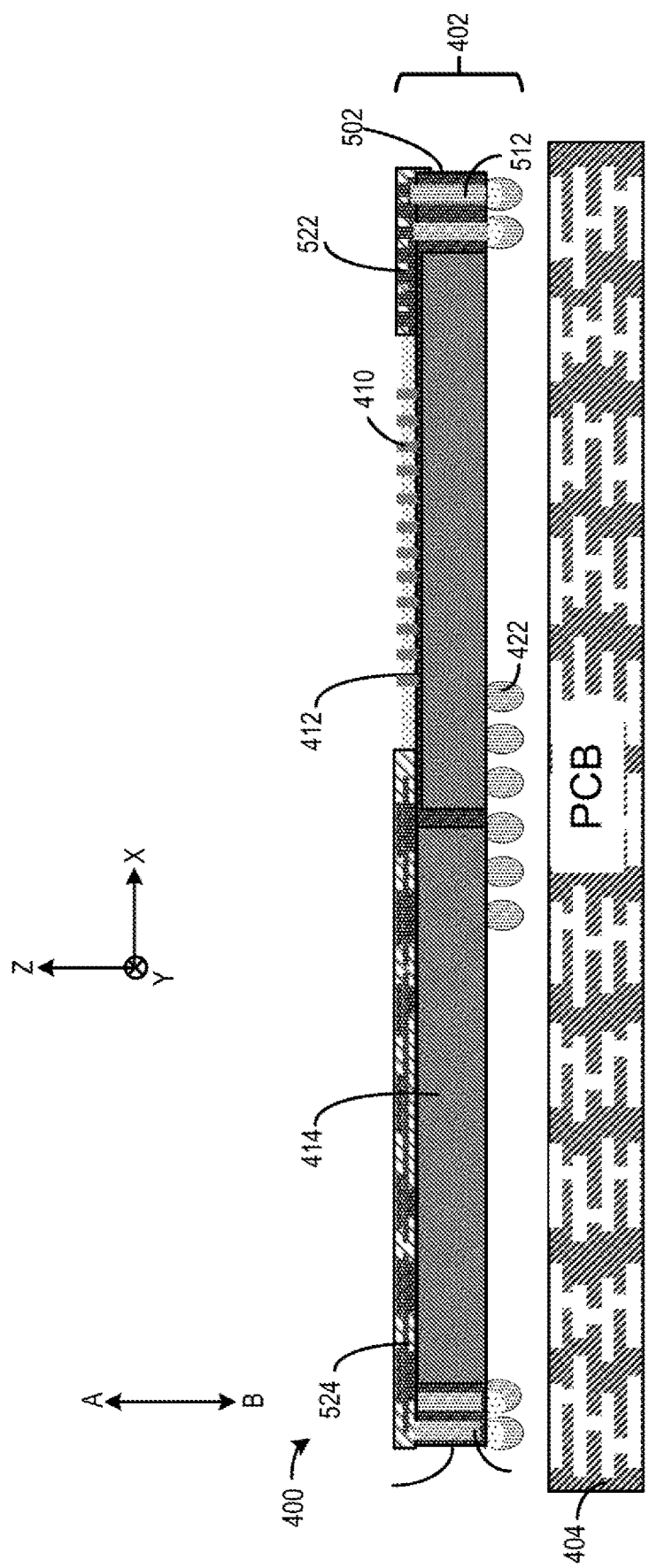
FIG. 5A and FIG. 5B illustrate examples of the display device of FIG. 3, according to examples of the disclosed techniques.
Figure 5B:
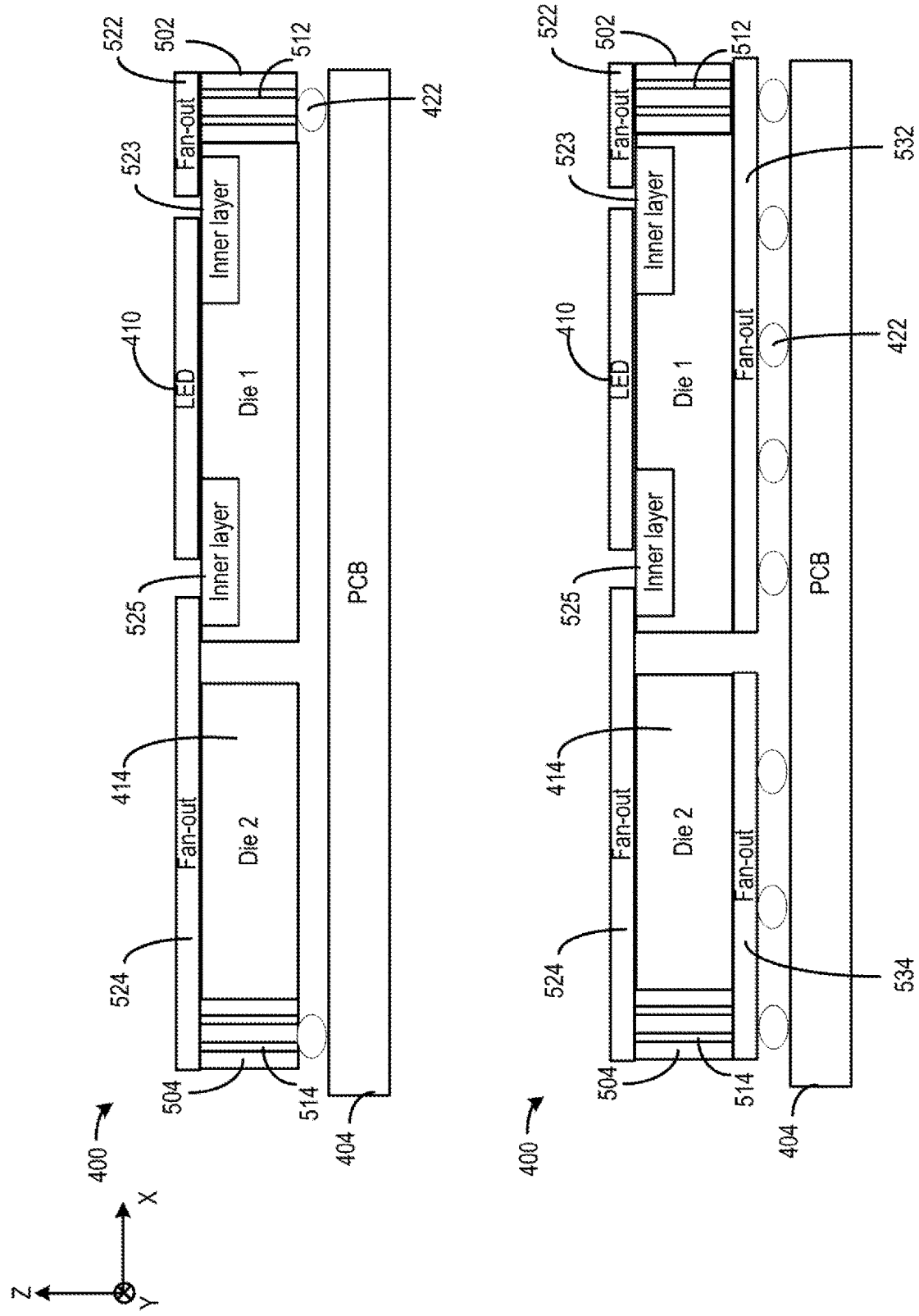

FIG. 5A and FIG. 5B illustrates examples of display system 400 of FIG. 4A in which first die 412 and second die 414 are arranged along a lateral direction. As shown in FIG. 5A, IC chip 402 can include a shoulder structure 502 abutting first die 412 along the lateral direction (e.g., parallel with X or Y-axis) and a shoulder structure 504 abutting second die 414. Each of shoulder structures 502 and 504 may include, respectively, electrical conduction paths 512 and 524 that extend across a thickness of first die 412 or second die 414. Fan-out circuit 522 can be configured as a redistribution layer (RDL), which comprises a metal layer to provide electrical connections. FIG. 5B illustrates that fan-out circuit 522 can be electrically connected to an inner layer circuit 523 of first die 412 via I/O pads (not shown in FIG. 5B). Fan-out circuit 522 also extends over shoulder structure 502 and can be electrically connected to one end of electrical conduction paths 512. The other end of electrical conduction paths 512 can be electrically connected to at least some of I/O bumps 422. In some examples, as shown in the top diagram of FIG. 5B, I/O bumps 422 can be placed on the back side of shoulder structure 502 (e.g., a side facing towards direction B) and directly connected to electrical conduction paths 512. In some examples, as shown in the bottom diagram of FIG. 5B, IC chip 402 may include a fan-out circuit 532 configured as a back side RDL that extends from shoulder structure 502 to a back side of first die 412 (e.g., a side facing towards direction B), and the I/O bumps 422 can be positioned on the back side RDL. Electrical conduction paths 512 can be connected to the I/O bumps 422 via the back side RDL. In both examples, fan-out circuits 522 and/or 532, together with electrical conduction paths 512, can be part of first circuit 430 of FIG. 4A to provide electrical connections between LED devices 410 and I/O bumps 422. The use of a back side RDL can increase the number of I/O bumps 422 available and can be driven by a routing density.

In addition, IC chip 402 also includes a fan-out circuit 524 that extends from shoulder structure 504 over second die 414 to first die 412. Fan-out circuit 524 can also be configured as an RDL. In FIG. 5B, fan-out circuit 524 can be electrically connected to an inner layer circuit of second die 414 and an inner layer circuit 525 of first die 412 via I/O pads (not shown in FIG. 5B). Fan-out circuit 524 also extends over shoulder structure 504 and can be electrically connected to one end of electrical conduction paths 514. The other end of electrical conduction paths 514 can be electrically connected to at least some of I/O bumps 422. In some examples, as shown in the top diagram of FIG. 5B, I/O bumps 422 can be placed on the back side of shoulder structure 504 (e.g., a side facing towards direction B) and directly connected to electrical conduction paths 514. In some examples, as shown in bottom diagram of FIG. 5B, the IC chip 402 may include another fan-out circuit configured as a back side RDL that extends from shoulder structure 504 to a back side of second die 414 (e.g., a side facing towards direction B), and the I/O bumps 424 can be positioned on the back side RDL. Electrical conduction paths 514 can be connected to the I/O bumps 422 via the back side RDL. In both examples, fan-out circuits 524 and/or 534 together with electrical paths 514 can be part of first circuit 430 of FIG. 4A to provide electrical connections between LED devices 410 and I/O bumps 422. In addition, fan-out circuit 524 and electrical paths 514 can also be part of second circuit 440 to provide electrical connections between second die 414 and first die 412 for, for example, transmission of power, control signals, data signals, etc.

Both shoulder structures 502 and 504 can be made of an epoxy molding compound (EMC). The shoulder structures can be fabricated when first die 412 and second die 414 are on a carrier substrate. For example, after first die 412 and second die 414 are transferred onto a carrier substrate, molds can be positioned adjacent to first die 412 and second die 414 on the carrier substrate, and the molds can be filled with EMC to form the shoulder structures. In certain embodiments, shoulder structure 502 and 504 may be parts of a uni-body packaging structure formed around first die 412 and second die 414. Moreover, electrical conduction paths 512 and 514 can be made of copper and can be fabricated by, for example, drilling through holes through shoulder structures 502 and 504 and depositing copper into the through holes.

Fan-out circuits 522 and 524 can be formed in a fan-out process after shoulder structures 502 and 504 are formed. Two types of fan-out processes can be used to form fan-out circuits 522 and 524. A first type of fan-out process can be a face-down process in which dies 412 and 414 are placed face down on a flat carrier to ensure co-planarity of the die surfaces. Shoulder structures 502 and 504 can also be formed on the flat surface and become co-planar with dies 412 and 414. The flat carrier is then removed (e.g., by etching away) to expose the die surfaces, and fan-out circuits 522 and 524 can then formed on the exposed surface. A second type of fan-out process can be a face-up process in which dies 412 and 414 are placed face up on the carrier. A grinding process can be applied on the die surfaces of dies 412 and 414 to ensure co-planarity. In some examples, process bumps can be formed on the die surfaces to accommodate the lack of co-planarity. After the grinding process, some remnant of the process bumps may remain and can be used as I/O pads between the dies and the fan-out circuits.

Figure 6:
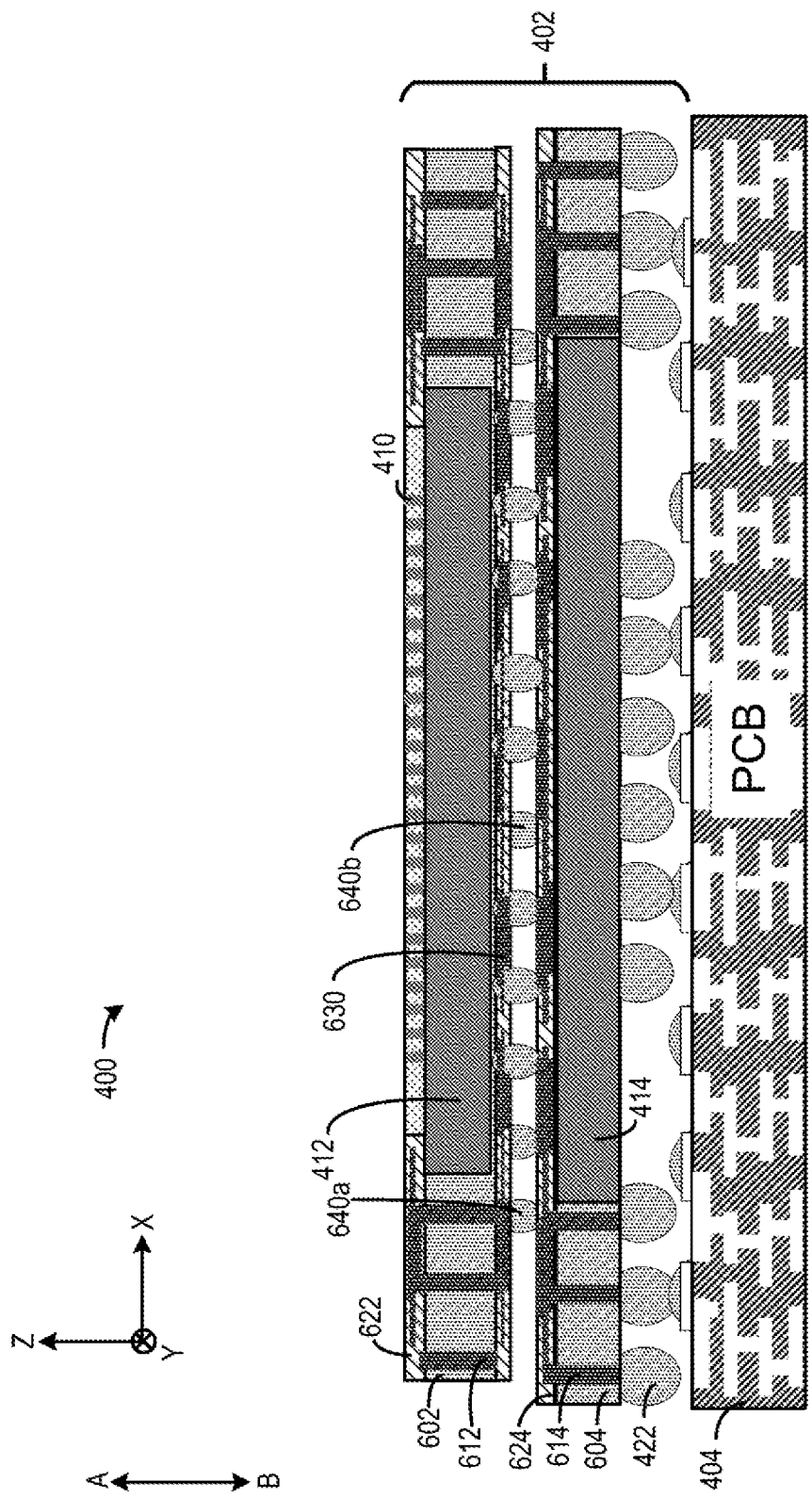
FIG. 6 illustrates examples of the display device of FIG. 3, according to examples of the disclosed techniques.

FIG. 6 illustrates an example of display system 400 of FIG. 4B in which first die 412 and second die 414 are arranged in a stack along a vertical direction. As shown in FIG. 6, IC chip 402 includes a first shoulder structure 602 abutting first die 412 along the lateral direction and a second shoulder structure 604 abutting second die 414 along the lateral direction. First shoulder structure 602 includes first electrical conduction paths 612 that extend along the vertical direction and across a thickness of first die 412, whereas second shoulder structure 604 includes second electrical conduction paths 614 that extend along the vertical direction and across a thickness of second die 414. IC chip 402 further includes a first fan-out circuit 622 that extends from first shoulder structure 602 to first die 412 to provide electrical connections between LED devices 410 and first electrical conduction paths 612 (via an inner layer circuit of first die 412). IC chip 402 further includes a second fan-out circuit 624 that extends from second shoulder structure 604 to second die 414 to provide electrical connections between the second electrical conduction paths 614 and second die 414. Second electrical conduction paths 614 can be electrically connected to at least some of I/O bumps 422, whereas first electrical conduction paths 612 are electrically connected to second electrical conduction paths 614. Through first electrical conduction path 612 and second electrical conduction path 614, electrical connections can be provided between LED devices 410 and I/O bumps 422, and between first die 412 and second die 414. Both first fan-out circuit 622 and second fan-out circuit 624 are configured as an RDL layer, according to various embodiments of the disclosure.

There are various ways to electrically connect between first electrical conduction path 612 and second electrical conduction path 614. For example, I/O bumps 640 (e.g., I/O bump 640a) can be sandwiched between first shoulder structure 602 and second shoulder structure 604 (and between first electrical conduction path 612 and second electrical conduction path 614) to provide the electrical connections. As another example, as shown in FIG. 6, IC chip 402 may further include a back side fan-out circuit 630 formed on a backside of first die 412 (facing towards direction B). Back side fan-out circuit 630 can extend over to second shoulder structure 614 and is electrically connected to second electrical conduction paths 614. Back side fan-out circuit 630 forms opposite RDL layers with fan-out circuit 624 (on second die 414). I/O bumps 640 (e.g., I/O bump 640b) can be sandwiched between the opposite RDL layers to provide electrical connections between the opposite RDL layers and first electrical conduction path 612 and second electrical conduction path 614.

In addition, I/O bumps 422 can be distributed based on the examples of FIG. 5B. For example, I/O bumps 422 can be placed only under second shoulder structure 604, or over another back side RDL layer under second die 414.

There are various advantages with the arrangements of FIG. 6. For example, the stack structure can reduce the foot print of IC chip 402. Moreover, as the sizes of shoulder structures are flexible and can be expanded to accommodate more I/O bumps, the number of I/O bumps 640 (between the first die and the second die) and the number of I/O bumps 422 (between the second die and the circuit board) can be largely independent of the sizes of the first die and the second die, which adds flexibility to the fabrication and application of IC chip 402.

Figure 7A:
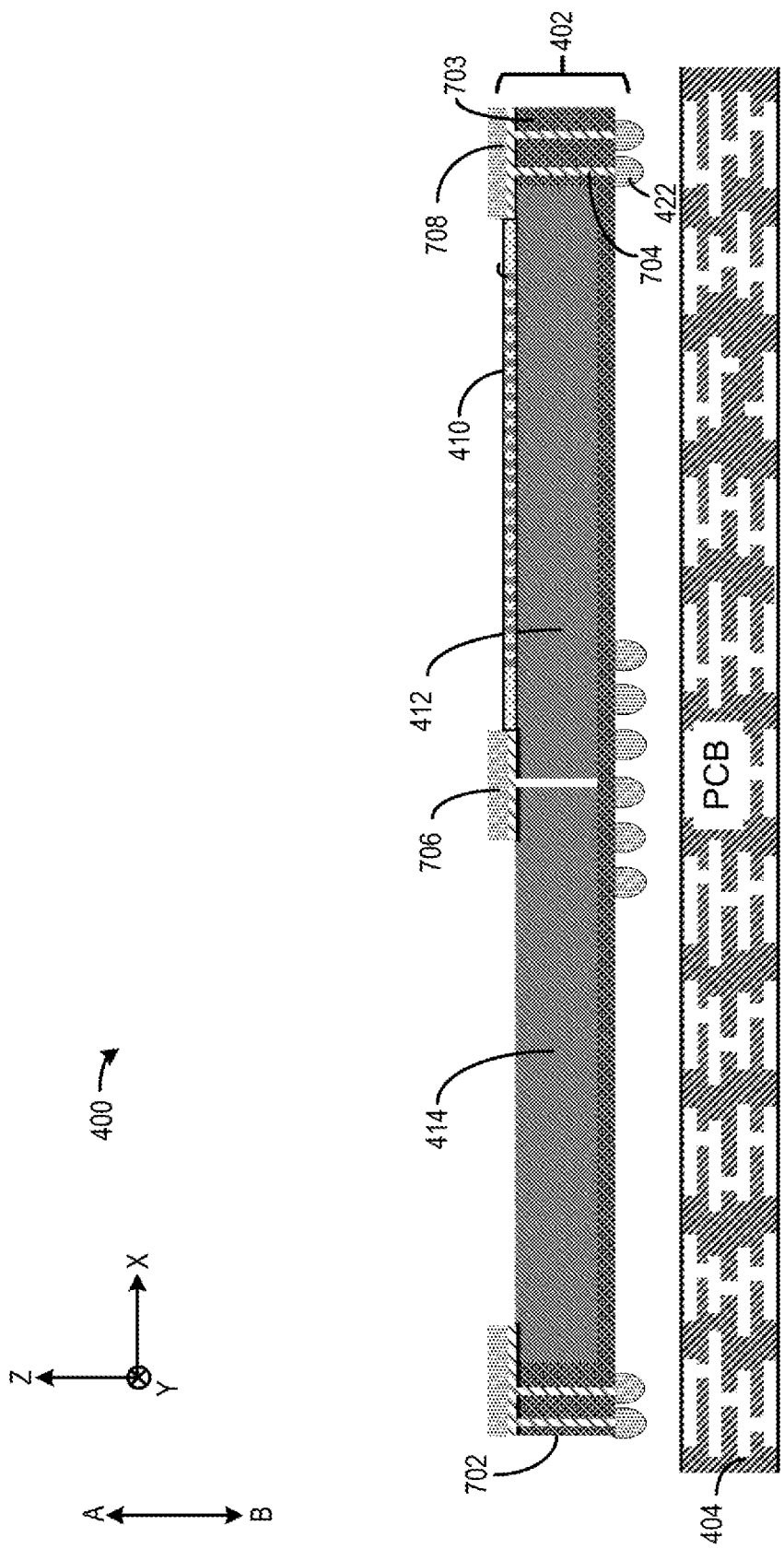
FIG. 7A, FIG. 7B, FIG. 7C, and FIG. 7D illustrate examples of the display device of FIG. 3, according to examples of the disclosed techniques.

FIG. 7A, FIG. 7B, FIG. 7C, and FIG. 7D illustrate other example structures of IC chip 402. As shown in FIG. 7A, IC chip 402 can include a chip carrier 702 that holds first die 412 and second die 414, with the dies being arranged along a lateral direction (e.g., parallel with X/Y axes). Chip carrier 702 further includes shoulder structures 703 which can hold electrical conduction paths 704 that extend along a vertical direction (e.g., along the Z axis) and across a thickness of first die 412. IC chip 402 further includes bridge circuits 706 and 708. Bridge circuit 706 can provide electrical connections between first die 412 and second die 414. Bridge circuit 708 can provide electrical connections between first die 412 (and LED devices 410) and electrical conduction paths 704. Electrical conduction paths 704 are also electrically connected to I/O bumps 422. Bridge circuit 708 and electrical conduction paths 704 can provide electrical connections between LED devices 410 and I/O bumps 422.

Figure 7B:
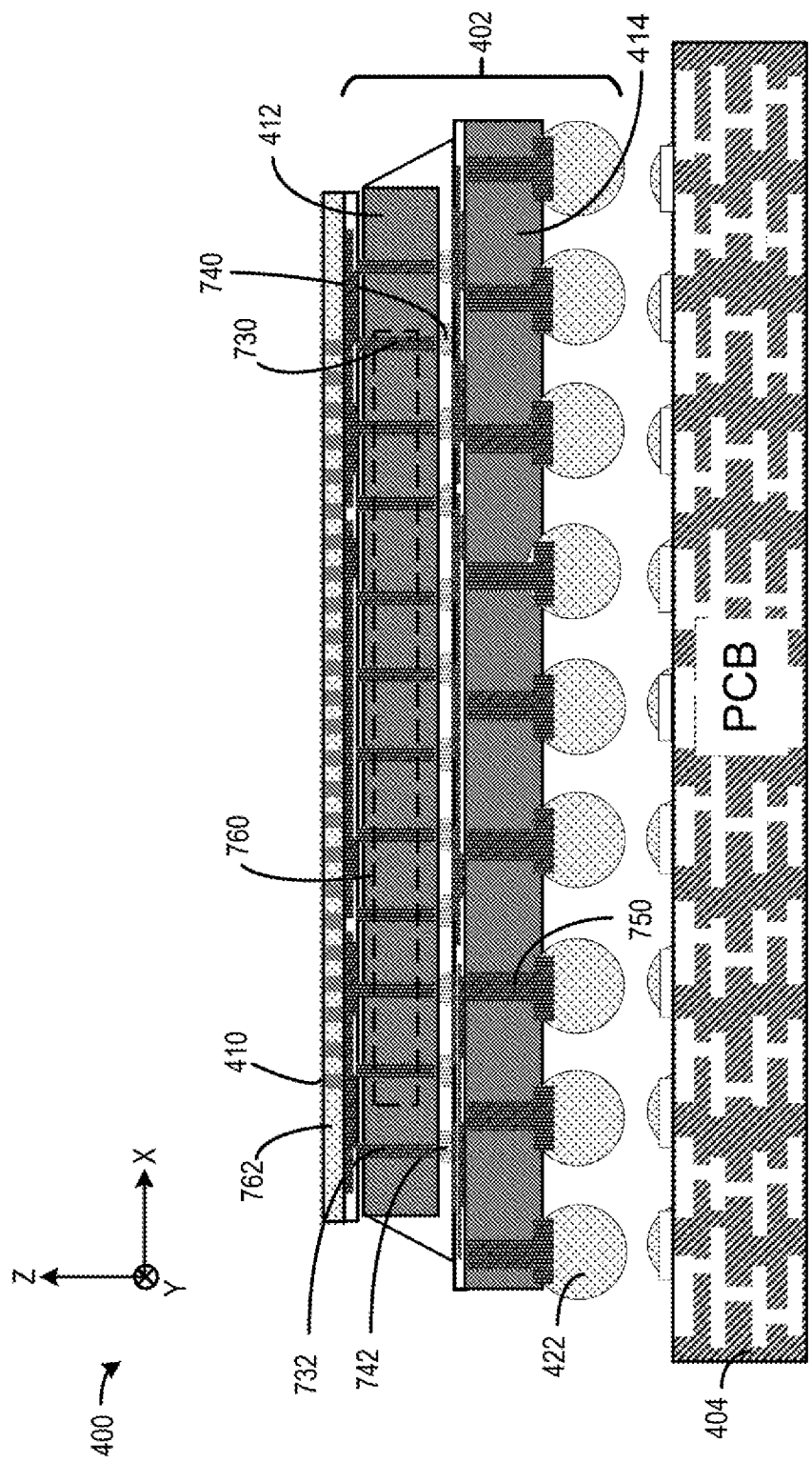

FIG. 7B illustrates an example of IC chip 402 in which first die 412 and second die 414 form a stack. In FIG. 7B, each of first die 412 and second die 414 include through silicon vias (TSV) that extends vertically (along the Z axis) through the dies. Electrical connections between LED devices 410 and I/O bumps 422 can be provided by, for example, TSV 730 of first die 412, I/O bump 740, and TSV 750 of second die 414. The electrical connections can be used to provide, for example, power to driver circuits 306 and current return paths 322. Moreover, electrical connections between first die 412 and second die 414 can be provided TSV 732 of first die 412 and I/O bump 742. Fan-out circuits may be formed on the first die and the second die to provide electrical connections to bumps 740/742 and I/O bumps 422.

The arrangements in FIG. 7B can provide numerous advantages. First, the package size can be reduced, as the electrical paths between LED devices 410 and bumps 740/742 (e.g., return path 322, power line, etc., as represented by first circuit 430) are confined within first die 412. Therefore, no external structure is needed to be positioned lateral to first die 412 (along the X/Y axes), as shoulder structure 602 of FIG. 6 and shoulder structure 703 of FIG. 7A to hold the electrical paths, which can reduce the footprint of IC chip 402. Moreover, some or all of the TSVs of first die 412 (e.g., TSV 730) can be formed in an active area 760 underneath a pixel area include LED devices 410. Active area 760 may include, e.g., driver circuits 306 and other semiconductor devices that control LED devices 410. Having the TSVs passing through active area 760 within first die 412 can further reduce the routing distances for the power and return paths implemented with the TSVs, which can improve the robustness of the power and ground system.

The arrangements in FIG. 7B, however, can pose numerous challenges in a case where the TSVs are fabricated after the LED devices 410 are placed onto first die 412. Specifically, the TSVs can be formed by etching trenches vertically from front side 762 through first die 412, followed by filling the trenches with metal (or other conductive materials). But the etching can potentially damage LED devices 410, and special care may be needed to protect LED devices 410 from the etching action, such as creating keep-out zones in active area 760 in which the driver circuits and LED devices 410 are not to be placed, to provide more isolations between LED devices 410 and the TSVs. But such arrangements can add complexity to the processes of fabricating the TSVs, first die 412, as well as IC chip 402 as a whole. Typically the TSVs in FIG. 7B need to be fabricated as part of the fabrication process of first die 412, such that the placements of the active devices and the TSVs in first die 412 can satisfy the limitations imposed by the keep-out zones.

Figure 7C:
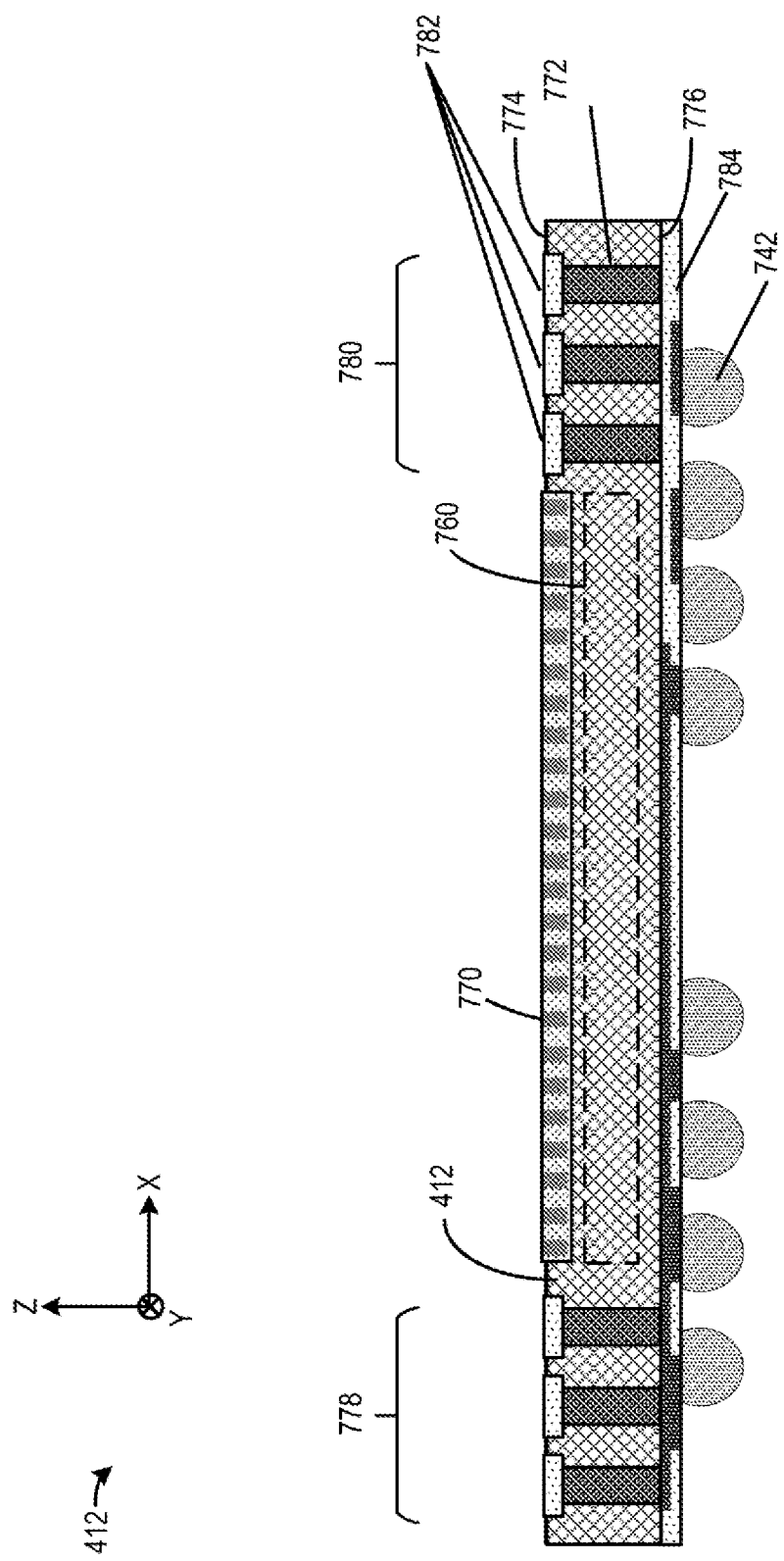

FIG. 7C illustrates another example of first die 412 which includes an alternative arrangements of TSVs and can be part of IC chip 402. As shown in FIG. 7C, first die 412 includes active area 760, and a pixel area 770 including LED devices 410 stacks on top of active area 760. First die 412 further includes TSV 772 which extend vertically (along the Z axis) through a thickness of first die 412 from a front side 774 (facing the positive Z direction) of first die 412 to a back side 776 (facing the negative Z direction) of first die 412. Unlike the TSVs of FIG. 7B, the TSVs in the example of FIG. 7C are formed in peripheral areas 778 and 780 of first die 412 that are outside of active region 760. First die 412 further includes bonding pads 782 formed on front side 774, and electrical bridge structures (not shown in FIG. 7C) can provide electrical connections between pixel area 770 and the TSVs via the bonding pads 782. Moreover, a metal layer 784 (e.g., a redistribution layer) can be formed on back side 776 of first die 412 to provide electrical connections from the TSVs to I/O bumps on the back side (e.g., I/O bump 742).

As in the arrangements of TSVs in FIG. 7B, the arrangements of TSVs in FIG. 7C allows the package size to be reduced by confining the electrical paths between LED devices 410 and bump 742 (e.g., return path 322, power line, etc., as represented by first circuit 430) within first die 412. However, as the TSVs are formed in a separate area from active area 760 and pixel area 770, the fabrication of the TSVs pose much lower risk to LED devices 410 in pixel area 770, especially in a case where in a case where the TSVs are fabricated after the LED devices 410 are placed onto first die 412. Compared with FIG. 7B, the fabrication of TSVs in FIG. 7C can be performed using less sophisticated processes. For example, as described above, the TSVs in FIG. 7B need to be fabricated as part of the fabrication process of first die 412, such that the placements of the active devices and the TSVs in first die 412 can satisfy the limitations imposed by the keep-out zones. But in the example of FIG. 7C, since the active devices and the TSVs are kept in different areas, there is no need to provide keep-out zones in active area 760, and the fabrication and placement of the active devices in active area 760 need not take into account the TSVs. Moreover, the fabrication of the TSVs can be performed outside the fabrication process of the devices within first die 412. Instead, the fabrication of the TSVs in FIG. 7C can be part of a post-processing in a packaging operation of forming IC chip 402. As a result, the arrangements of TSVs in FIG. 7C can reduce the complexity of fabrication of the TSVs, as well as the formation of IC chip 402 as a whole, while reducing the chip footprint and providing robust electrical connection between LED devices 410 on the front side and bumps on the back side of first die 412.

Figure 7D:
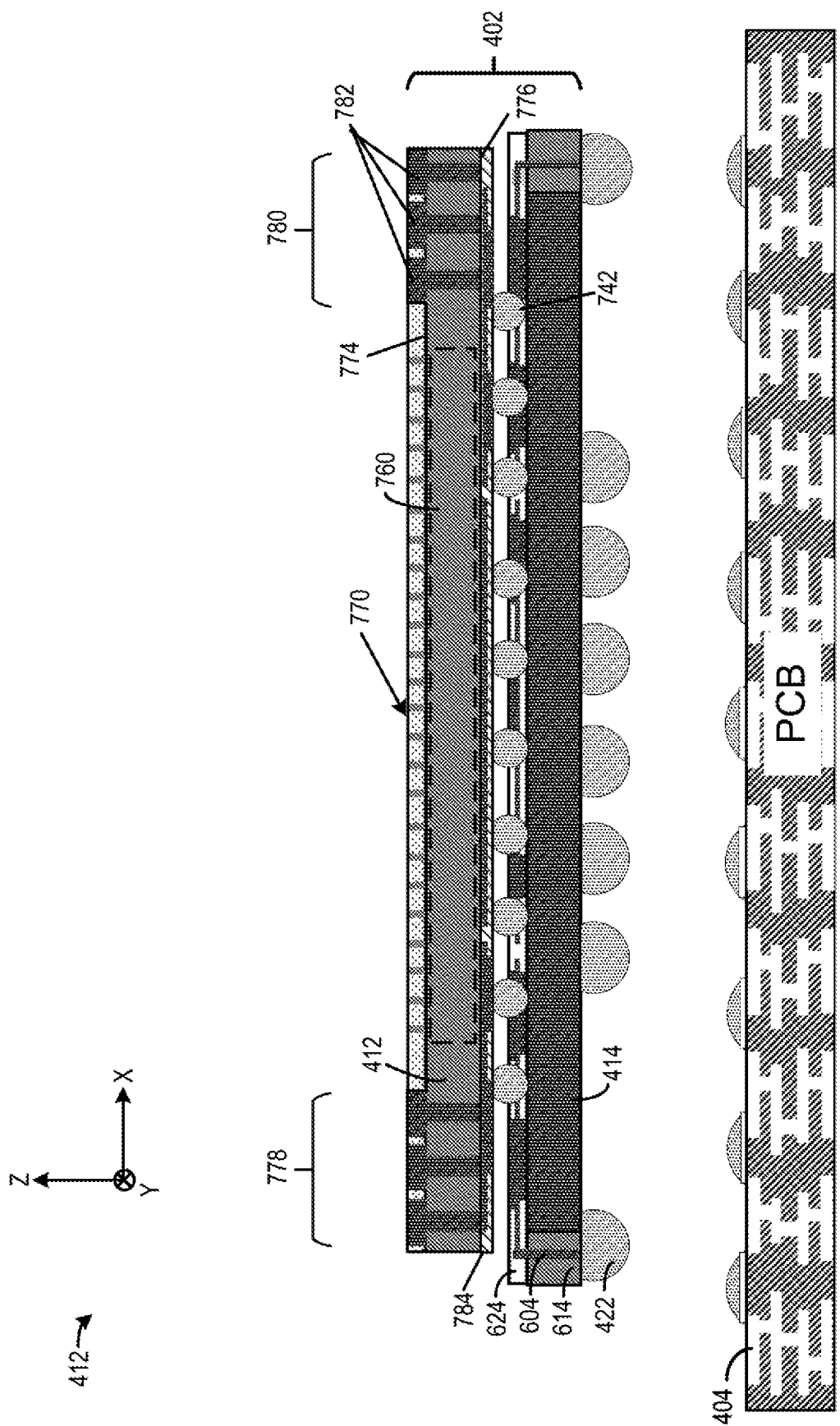

First die 412 formed using the TSV arrangements in FIG. 7C can be combined with second die 414 formed using various techniques in this disclosure to form IC chip 402. As an example, first die of FIG. 7C can be combined with second die 414 of FIG. 7B to form IC chip 402. As another example, as shown in FIG. 7D, first die 412 of FIG. 7C can be combined with second die 414 of FIG. 6 to form IC chip 402. As described above, second die 414 in the example of FIG. 6 includes second shoulder structure 604, which includes second electrical conduction paths 614 that extend along the vertical direction and across a thickness of second die 414. IC chip 402 further includes second fan-out circuit 624, which can be configured as an RDL layer and can extend from second shoulder structure 604 to second die 414 to provide electrical connections between the second electrical conduction paths 614 and second die 414. Advantages provided by the arrangements of FIG. 7D may include, for example, the die size of second die 414 being independent from the die size of first die 412, as second shoulder structure 606 can be made such that the overall footprint of second die 414 with second shoulder structure 606 matches the overall footprint of first die 414. Moreover, as explained above, the shoulder structures can be expanded to accommodate more I/O bumps, the number of I/O bumps 640 (between the first die and the second die) and the number of I/O bumps 422 (between the second die and the circuit board) can be largely independent of the sizes of the first die and the second die, which adds flexibility to the fabrication and application of IC chip 402.

Figure 8:
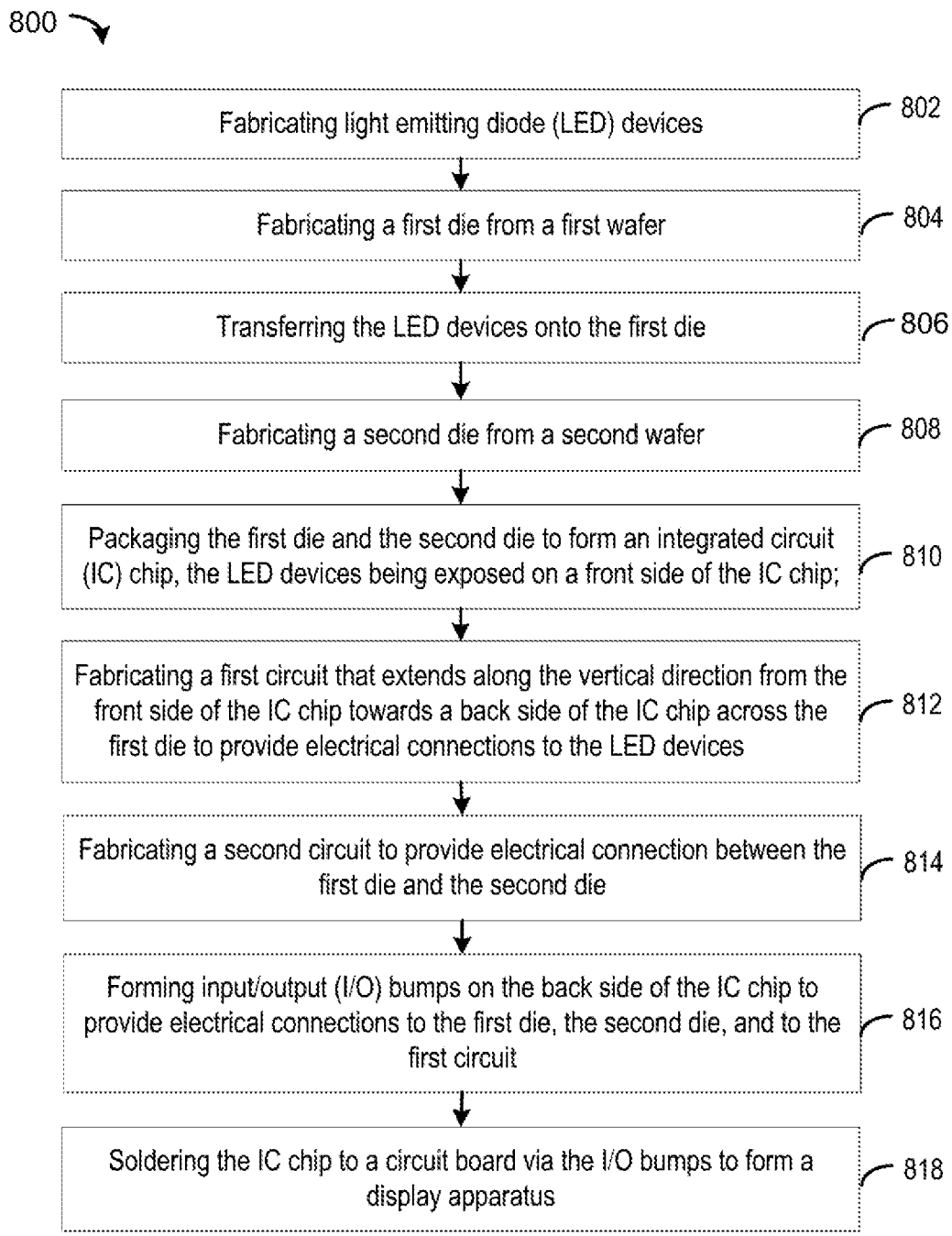
FIG. 8 illustrates an example of a method for manufacturing a display device, according to examples of the disclosed techniques.

FIG. 8 illustrates a method 800 of manufacturing a display system, such as display system 400. Method 800 starts with step 802, in which light emitting diode (LED) devices are fabricated. The LED devices can be fabricated from, for example, a crystal wafer (e.g., sapphire).

In step 804, a first die can be fabricated from a first wafer. The first die can include driver circuits for the LED devices.

In step 806, the LED devices can be transferred onto the first die by, for example, bonding the LED devices with the first die.

In step 808, a second die can be fabricated from a second wafer. The second die can include control circuits for the driver circuits. The second wafer can have different process nodes from the first wafer.

In step 810, the first die and the second die can be packaged to form an integrated circuit (IC) chip, the LED devices being exposed on a front side of the IC chip. The packaged IC chip can be according the examples of FIG. 4A to FIG. 7B.

In step 812, a first circuit can be fabricated within the IC chip. The first circuit extends along the vertical direction from the front side of the IC chip towards a back side of the IC chip across the first die to provide electrical connections to the LED devices. In some examples, the first circuit can be part of a shoulder structure abutting the dies. In some examples, the first circuit can be TSVs formed across the thickness of the first die. In some examples, the TSVs can be formed within the active area of first die which contains driver circuits for the LED devices. In some examples, the TSVs can be formed in a peripheral area of the first die that is outside the active area as well as the pixel area that contains the LED devices. The TSVs can be formed by etching through a first surface of the first die after the LED devices are transferred on the first surface of the first die which includes the driver circuit in step 806.

In step 814, a second circuit can be fabricated within the IC chip. The second circuit can provide electrical connection between the first die and the second die and can include fan-out circuits. Further, a third circuit may be added in the vertical direction, such as in the shoulder of the second die through vertical interconnects 612 and 614, to provide electrical connection between the second die and the first circuit.

In step 816, input/output (I/O) bumps are formed on the back side of the IC chip to provide electrical connections to the first die, the second die, and to the first circuit.

In step 818, the IC chip is electrically connected a circuit board via the I/O bumps to form a display apparatus.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

I claim:

1. A display apparatus comprising:
   an integrated circuit (IC) chip comprising:
   light emitting diode (LED) devices exposed on a front side of the IC chip;
   input/output (I/O) bumps on a back side of the IC chip;
   a first die forming a stack with the LED devices along a vertical direction, the first die comprising driver circuits electrically connected to the LED devices and electrically connected to at least some of the I/O bumps;
   a first circuit that extends along the vertical direction from the front side of the IC chip towards the back side of the IC chip and across at least a thickness of the first die to provide electrical connections between the LED devices and at least some of the I/O bumps;
   a second die including pipelining circuits and control circuits for the driver circuits of the first die and electrically connected to at least some of the I/O bumps;
   a second circuit that extends from the second die to the first die to provide electrical connections between the first die and the second die; and
   a circuit board electrically connected to the I/O bumps of the IC chip and to a power system to provide electrical connections between the power system and each of the first die, the second die, and the LED devices of the IC chip.

2. The display apparatus of claim 1, wherein the first die is positioned adjacent to the second die along a lateral direction within the IC chip, the lateral direction being perpendicular to the vertical direction.

3. The display apparatus of claim 2, wherein the IC chip includes a shoulder structure abutting the first die along the lateral direction; and
 wherein the first circuit comprises electrical conduction paths that extend through the shoulder structure along the vertical direction.

4. The display apparatus of claim 3, wherein the IC chip includes a redistribution layer (RDL) adjacent to the LED devices along the lateral direction; and
 wherein the RDL extends over at least a part of the shoulder structure and at least a part of the first die to provide electrical connections between the first die and the first circuit.

5. The display apparatus of claim 4, wherein the first die comprises an inner layer circuit to electrically connect between the LED devices and the RDL.

6. The display apparatus of claim 2, wherein the IC chip includes a shoulder structure abutting the second die along the lateral direction; and
 wherein the first circuit comprises electrical conduction paths that extend through the shoulder structure along the vertical direction.

7. The display apparatus of claim 6, wherein the IC chip includes, as part of the second circuit, an RDL adjacent to the LED devices along the lateral direction; and
 wherein the RDL extends over at least a part of the shoulder structure, the second die, and at least a part of the first die to provide electrical connections between the first die and the first circuit and between the first die and the second die.

8. The display apparatus of claim 7, wherein the first die comprises an inner layer circuit to provide electrical connections between the LED devices and I/O bumps on the front side of the IC chip.

9. The display apparatus of claim 3, wherein the I/O bumps on the back side of the IC comprise I/O bumps formed on the shoulder structure and electrically connected to the electrical conduction paths of the shoulder structure.

10. The display apparatus of claim 4, wherein the RDL is a first RDL;
 wherein the IC chip further comprises a second RDL, the second RDL covering at least a part of a second shoulder structure abutting the second die along the lateral direction, the first die, and the second die to provide electrical connections to the first circuit, the first die, and the second die; and
 wherein the I/O bumps on the back side of the IC comprise I/O bumps formed on the second shoulder structure and electrically connected to electrical conduction paths of the second shoulder structure.

11. The display apparatus of claim 3, wherein the shoulder structure is formed to abut the first die when the first die is on a carrier substrate.

12. The display apparatus of claim 3, wherein the shoulder structure includes an epoxy molding compound (EMC).

13. The display apparatus of claim 12, wherein the shoulder structure is formed by filling a mold with the EMC.

14. The display apparatus of claim 3, wherein the electrical conduction paths include copper.

15. The display apparatus of claim 2, wherein the IC chip includes a chip carrier to hold both the first die and the second die; and
 wherein the first circuit comprises electrical conduction paths that extend through the chip carrier along the vertical direction to reach the I/O bumps on the back side of the IC chip.

16. The display apparatus of claim 15, wherein the IC chip includes a first bridge circuit that extends over a part of the chip carrier and a part of the first die to provide electrical connections between the first circuit and the first die.

17. The display apparatus of claim 16, wherein the first die further includes an inner layer circuit to provide electrical connections between the first circuit and the LED devices.

18. The display apparatus of claim 16, wherein the IC chip includes, as part of the second circuit, a second bridge circuit that extends over a part of the first die and a part of the second die to provide electrical connections between the first die and the second die.

19. The display apparatus of claim 16, wherein the chip carrier comprises a ceramic material.

20. The display apparatus of claim 1, wherein the first die forms a stack with the second die along the vertical direction within the IC chip.

21. The display apparatus of claim 20, further comprising:
 a first shoulder structure abutting the first die along a lateral direction perpendicular to the vertical direction; and
 a second shoulder structure abutting the second die along the lateral direction,
 wherein the first circuit comprises first electrical conduction paths that extend through the first shoulder structure along the vertical direction and second electrical conduction paths that extend through the second shoulder structure along the vertical direction.

22. The display apparatus of claim 21, wherein the IC chip includes:
 a first RDL adjacent to the LED devices and extending over at least a part of the first shoulder structure and a part of the first die to provide electrical connections between the first die and the first electrical conduction paths; and
 a second RDL facing the first die and extending over at least a part of the second shoulder structure and a part of the second die to provide electrical connections between the second die and the second electrical conduction paths,
 wherein the first RDL and the second RDL are part of the second circuit.

23. The display apparatus of claim 22, further comprising I/O bumps between the first shoulder structure and the second shoulder structure to provide electrical connections between the first electrical conduction paths and the second electrical conduction paths.

24. The display apparatus of claim 22, further comprising:
 a third RDL that extends over a part of the first shoulder structure and a part of the first die, the third RDL being electrically connected to the first electrical conduction paths of the first should structure and facing the second RDL; and
 I/O bumps sandwiched between the third RDL and the second RDL to provide electrical connections between the third RDL and the second RDL.

25. The display apparatus of claim 22, wherein the I/O bumps on the back side of the IC chip comprises I/O bumps on the second shoulder structure and electrically connected to the second electrical conduction paths of the second shoulder structure.

26. The display apparatus of claim 20, wherein the first die comprises, as part of the first circuit, a plurality of first through silicon vias (TSVs) electrically connected to the LED devices; and wherein the second die comprises, as part of the first circuit, a plurality of second TSVs electrically connected to the plurality of first TSVs; and wherein the I/O bumps on the back side of the IC chip are electrically connected to the plurality of second TSVs.

27. The display apparatus of claim 26, wherein the second die comprises, as part of the second circuit, a plurality of third TSVs electrically connected to the first die.

28. The display apparatus of claim 26, wherein the plurality of first TSVs are formed in a peripheral area of the first die; and wherein the peripheral area is outside a pixel area of the first die on which the LED devices are formed.

29. The display apparatus of claim 20, wherein the first die comprises, as part of the first circuit, TSVs electrically connected to the LED devices and formed in a peripheral area of the first die;

wherein the peripheral area is outside a pixel area of the first die on which the LED devices are formed; and wherein the display apparatus further includes, as part of the first circuit, electrical conduction paths that extend through a shoulder structure, the shoulder structure abutting the second die along the lateral direction.

30. The display apparatus of claim 1, wherein the first die is fabricated from a first wafer and the second die is fabricated from a second wafer.

31. The display apparatus of claim 30, wherein the first wafer and the second wafer are associated with at least one of: different operating voltages, or different process nodes.

32. A method, comprising:
fabricating light emitting diode (LED) devices;
fabricating a first die from a first wafer to include driver circuits in the first die;
transferring the LED devices onto the first die;
fabricating a second die from a second wafer;
packaging the first die and the second die to form an integrated circuit (IC) chip, the LED devices being exposed on a front side of the IC chip;
fabricating a first circuit that extends along the vertical direction from the front side of the IC chip towards a back side of the IC chip across the first die to provide electrical connections to the LED devices;
fabricating a second circuit to provide electrical connection between the first die and the second die;
forming input/output (I/O) bumps on the back side of the IC chip to provide electrical connections to the first die, the second die, and to the first circuit; and
connecting the IC chip to a circuit board via the I/O bumps to form a display apparatus.

33. The method of claim 32, wherein the first circuit comprises through silicon vias (TSV); and wherein the TSVs are fabricated by etching through a first surface of the first die after the LED devices are transferred onto the first surface of the first die that includes the driver circuits.

\* \* \* \* \*